US011303276B2

United States Patent
Contreras et al.

(10) Patent No.: US 11,303,276 B2
(45) Date of Patent: Apr. 12, 2022

(54) ACTIVE LOW-POWER TERMINATION

(71) Applicant: Western Digital Technologies, Inc., San Jose, CA (US)

(72) Inventors: John Thomas Contreras, Palo Alto, CA (US); Rehan Ahmed Zakai, San Ramon, CA (US); Srinivas Rajendra, Milpitas, CA (US); Venkatesh Prasad Ramachandra, San Jose, CA (US)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 0 days.

(21) Appl. No.: 17/187,308

(22) Filed: Feb. 26, 2021

(65) Prior Publication Data

US 2022/0052688 A1 Feb. 17, 2022

Related U.S. Application Data

(60) Provisional application No. 63/065,103, filed on Aug. 13, 2020.

(51) Int. Cl.
  *H03K 19/00* (2006.01)
  *H04L 25/02* (2006.01)
  *H03K 21/10* (2006.01)
  *H03K 19/017* (2006.01)

(52) U.S. Cl.
  CPC ....... *H03K 19/0005* (2013.01); *H03K 19/017* (2013.01); *H03K 21/10* (2013.01); *H04L 25/0298* (2013.01)

(58) Field of Classification Search
  None
  See application file for complete search history.

(56) References Cited

U.S. PATENT DOCUMENTS

| | | | |
|---|---|---|---|
| 5,530,377 A | 6/1996 | Walls | |
| 6,218,854 B1 | 4/2001 | Ko | |
| 6,307,395 B1 | 10/2001 | Kalb et al. | |
| 10,461,965 B1 | 10/2019 | Contreras et al. | |
| 2003/0099137 A1 | 5/2003 | Martin | |
| 2004/0155675 A1* | 8/2004 | Zerbe | H01L 27/0251 326/30 |
| 2005/0012519 A1 | 1/2005 | Viehmann et al. | |
| 2005/0122130 A1 | 6/2005 | Kiehl et al. | |

(Continued)

OTHER PUBLICATIONS

International Search Report and the Written Opinion for International Application No. PCT/US2021/034080 dated Oct. 28, 2021, 12 pages.

(Continued)

*Primary Examiner* — Jany Richardson
(74) *Attorney, Agent, or Firm* — Patterson & Sheridan, LLP; Steven H. Versteeg

(57) ABSTRACT

An active termination circuit comprising an input node connected to a transmission line, a first transistor, and a second transistor. The transmission line supplies a signal to the input node. The first transistor is diode connected between a high voltage supply and the input node. The first transistor terminates the signal when the signal is at a low logic level. The second transistor is diode connected between the input node and a low voltage supply. The second transistor terminates the signal when the signal is at a high logic level.

20 Claims, 16 Drawing Sheets

(56) References Cited

U.S. PATENT DOCUMENTS

| | | |
|---|---|---|
| 2005/0138239 A1 | 6/2005 | Kasahara |
| 2006/0221717 A1* | 10/2006 | Lee ..................... G11C 7/1051 |
| | | 365/189.04 |
| 2011/0267110 A1 | 11/2011 | McLeod |
| 2013/0022134 A1* | 1/2013 | Ben Artsi ......... H04L 25/03878 |
| | | 375/257 |
| 2014/0177356 A1 | 6/2014 | Su et al. |

OTHER PUBLICATIONS

International Search Report and the Written Opinion for International Application No. PCT/US2021/034080 dated Nov. 15, 2021, 13 pages.

* cited by examiner

ACTIVE LOW-POWER TERMINATION

CROSS-REFERENCE TO RELATED APPLICATIONS

This application claims benefit of U.S. Provisional Patent Application Ser. No. 63/065,103, filed Aug. 13, 2020, which is herein incorporated by reference.

BACKGROUND

The strong growth in demand for portable consumer electronics is driving a need for high-capacity storage devices. Non-volatile semiconductor memory devices, such as flash memory storage cards, are widely used to meet the ever-growing demands on digital information storage and exchange. Their portability, versatility and rugged design, along with their high reliability and large capacity, have made such memory devices ideal for use in a wide variety of electronic devices, including for example digital cameras, digital music players, video game consoles, PDAs, cellular telephones and solid state drives.

Semiconductor memory devices are often formed of a SiP (System in a Package) device including a number of memory die mounted in an offset stack on a substrate. The semiconductor die may be electrically coupled to each other and the substrate using wire bonds affixed to each die, cascading down the die stack. There is an increasing requirement for high performance with low power. Wire-bond and other electronic packages have inherent parasitic capacitance. Although parasitic capacitance levels have been decreasing, this decrease does not keep up with the growing bandwidth requirements for faster data throughput. Today, this bandwidth restriction is limited by the parasitic capacitances. A typical solution reverts to using lower impedance receiver termination, but this lower termination impedance increases power consumption when using passive resistive termination. Wire-bond and other electronic packages may benefit from solutions using lower receiver termination impedance without significantly increasing power consumption.

Some such solutions employ active termination circuits that implement a feedback loop and active biasing, a current mirror, and added current sources. These features may take up more area than is feasible for use in die termination. A solution is therefore needed that provides the benefits of active termination while taking up as little space as possible within an integrated circuit.

SUMMARY

This disclosure relates to an active termination circuit comprising an input node connected to a transmission line, a first transistor, and a second transistor. The transmission line is configured to supply a signal to the input node. The first transistor is diode connected between a high voltage supply and the input node. The first transistor is configured to terminate the signal when the signal is at a low logic level. The second transistor is diode connected between the input node and a low voltage supply. The second transistor is configured to terminate the signal when the signal is at a high logic level.

"High voltage supply" refers to a source for a voltage level used to operate an electrical circuit during normal operation. In certain embodiments, a high voltage supply may be represented by the symbol Vdd or Vccq. "Low voltage supply" refers to a structure or connection or component that serves as ground or serves to ground an electrical signal. In certain embodiments, a low voltage supply may be represented by the symbol G, GND, Vss or an inverted triangle.

"High logic level" refers to one of two possible logic levels used to represent binary data and/or binary signals. Typically, a high logic level represents the binary value '1.' "Low logic level" refers to one of two possible logic levels used to represent binary data and/or binary signals. Typically, a low logic level represents the binary value '0.'

This disclosure further relates to a system comprising first and second integrated circuits mounted on a printed circuit board, an interconnect, and an active termination circuit. The interconnect is configured to operate as a transmission line transmitting signals between the first and second integrated circuits. The active termination circuit is formed within the first or second integrated circuit, and comprises the features described above for the active termination circuit disclosed herein.

Finally, this disclosure relates to a method for calibrating an active termination circuit comprising an NMOS transistor diode connected between a high voltage supply and an input node and a PMOS transistor diode connected between the input node and a low voltage supply. First, a target input impedance range (Rin) for the active termination circuit is received. An input impedance is measured as an input current (Ln) applied to the input node transitions between a high logic level and a low logic level. It is then determined whether the measured input impedance falls within the target input impedance range. Finally, a strength for one of the NMOS transistor and PMOS transistor is calibrated in response to the input impedance falling outside the target input impedance range.

BRIEF DESCRIPTION OF THE DRAWINGS

Like-numbered elements refer to common components in the different figures.

DETAILED DESCRIPTION

Figure 1:
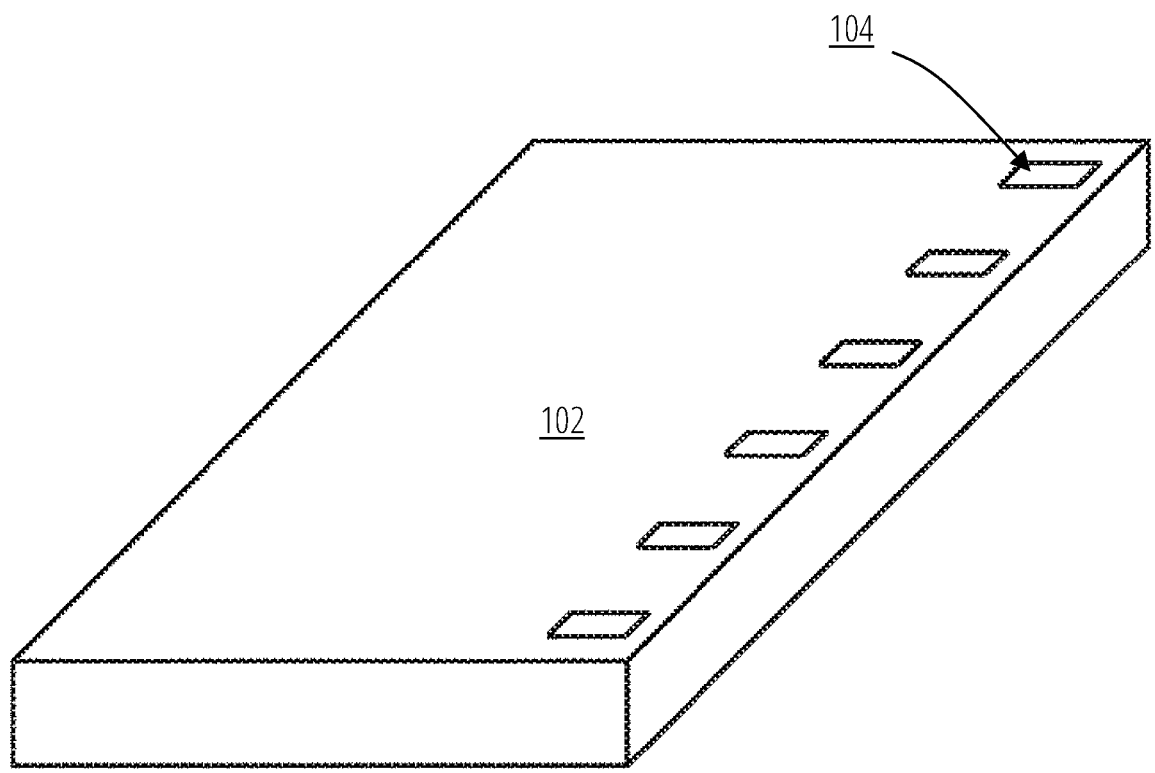
FIG. 1 is a schematic representation of an integrated circuit or semiconductor die that includes a number of die bonding pads.

The present technology will now be described with reference to the figures, which in embodiments, relate to a termination circuit for a transmission line, such as the bond wires used to connect the memory die of a memory device or other integrated circuits that use such interconnects to exchange signals.

"Transmission line" refers to a specialized cable or other structure designed to conduct alternating current, or oscillating signal or voltage at a radio frequency (about 20 kHz-300 GHz), or higher. The frequency of the signal is high enough that a wave nature of the signal is taken into account. Transmission line are used for purposes such as connecting radio transmitters and receivers with their antennas (they are then called feed lines or feeders), distributing cable television signals, trunk lines routing calls between telephone switching centers, computer network connections and high speed computer data buses. (Search "transmission line" and "radio frequency" on Wikipedia.com May 28, 2020. Modified. Accessed Jun. 4, 2020.)

"Signal" refers to an electrical signal (wired or wireless) sent from one component, circuit, driver, device, manager, or controller to another component, circuit, sub-circuit, driver, device, manager, or controller. In one embodiment, the signal comprises an analog signal. In another embodiment, the signal comprises a digital signal. In certain embodiments, the signal is configured to oscillate between a high state (e.g., high voltage level, high logic level) and a low state (e.g., low voltage level, low logic level). The signal may oscillate based on data values being communicated with the signal.

A signal may originate from a signal source. "Signal source" refers to a circuit, sub-circuit, electronic component, hardware, software, firmware, module, logic, device, or apparatus configured, programmed, designed, arranged, or engineered to supply a voltage, current, or electromagnetic wave that varies over time, either in analog or digital waveform, to another structure, circuit, sub-circuit, electronic component, logic, device, or apparatus.

As discussed above in the Background, a lower resistive termination increases the power used. The following discusses the use of CMOS active devices to create a digital signal's termination. The active circuit uses multi-modes of impedances while transitioning from a logic Low to a logic High and from switching from a logic High to a logic Low. The three main modes are to have a higher receiver impedance in a Low or High, but during a logic transition (L to H or H to L), the receiver impedance would be a low impedance for both bandwidth improvements and improved transmission line termination. In some embodiments, the impedance value may be programmable through calibration steps, along with temperature compensation. This new low-power termination architecture is an active low-power termination with inherent bias (ALPTib).

"Impedance" refers to a measure of the opposition that a circuit presents to a current when a voltage is applied. Quantitatively, the impedance of a two-terminal circuit element is the ratio of the complex representation of the sinusoidal voltage between its terminals, to the complex representation of the current flowing through the circuit. In general, impedance depends upon the frequency of the sinusoidal frequency with its associated parasitic capacitance. (Search "impedance" on Wikipedia.com May 31, 2020. Modified. Accessed Jun. 2, 2020.)

"Bias" refers to a direct current (DC) current or voltage supplied to one or more terminals of an active electronic component, such as a diode or transistor, configured to ensure proper operation of the active electronic component.

In electronics, bias usually refers to a fixed DC voltage or current applied to a terminal of an electronic component such as a diode, transistor in a circuit in which AC signals are also present, in order to establish proper operating conditions for the component. (Search "biasing" on Wikipedia.com Jun. 28, 2020. Modified. Accessed Jul. 15, 2020.) In certain embodiments, the AC signal may comprise a data signal on a transmission line.

"Electronic component" refers to any basic discrete device or physical entity in an electronic system used to affect electrons or their associated fields. ("electronic component" on Wikipedia. Apr. 18, 2020. Accessed May 15, 2020.)

Electronic components may be either passive electronic components or active electronic components. Active electronic components include transistors, diodes, integrated circuits, power sources, and the like. Passive electronic components include resistors, capacitors, and inductors and the like. ("electronic component" on Wikipedia. Apr. 18, 2020. Modified. Accessed Jun. 16, 2020.)

Conventional active termination circuit designs may provide a number of elements to manage bias, and these elements may expand the silicon area needed to implement those solutions.

In certain embodiments, the active termination circuit includes a pair of series connected transistors, each of which is diode connected and has its control gate connected to high voltage supply or low voltage supply as appropriate. The active termination circuit is suitable for termination use with bond wires carrying digital signals of relatively high voltage levels (i.e., on the order of 1 volt or more) between integrated circuits. The inherent bias of the (ALPTib) architecture may be leveraged to provide dynamic termination impedance. "Inherent bias" refers to a bias that exists within a circuit or sub-circuit due to the design and configuration of the circuit and/or its coupling to a high voltage supply (e.g., VDD) and a low voltage supply (e.g., Ground). Said another way, the inherent bias is supplied to terminals of one or more active electronic components of a circuit by the circuit itself. "Dynamic termination impedance" refers to a termination impedance expressed in Ohms that changes over time as a signal on a transmission line changes from a low logic level to a high logic level and vice versa.

A circuit such as the disclosed embodiments may take advantage of this inherent bias, and thus take up less space as well as draw less power, and therefore be more practical for certain integrated circuit designs. Various embodiments of the disclosed circuitry may be configured, or calibrated, for operation during the die sort phase of manufacturing in an example application. In addition, calibration of the disclosed embodiments may include adjustments for temperature effects as well as electrical characteristics of PMOS transistors used to implement an embodiment of this disclosed solution.

FIG. 1 is a schematic representation of a uniform memory die 102 or semiconductor die that includes a number of die bonding pads 104 by which the uniform memory die 102 may be connected by a transmission line, or wire bond, to other elements, such as other integrated circuits or a printed circuit board.

"Uniform memory die" refers to a memory die that includes the same, or substantially the same, components, electronic components, circuits, features, size, configuration, and/or capabilities as another memory die. "Bonding pad" refers to a conductive structure for connecting a trace and a wire bond or pin for an electrical connection.

"Wire bond" refers to a wire, often made of aluminum, alloyed aluminum, copper, silver, gold or doped gold, for interconnection of integrated circuits, communication buses and/or communication channels.

"Integrated circuit" refers to one or more electronic circuits that include one or more electronic components all contained within a single semiconductor structure.

"Printed circuit board" or "PCB" refers to a structure that mechanically supports and electrically connects electrical or electronic components using conductive tracks, traces, pads, and other features etched from one or more sheet layers of copper laminated onto and/or between sheet layers of a non-conductive substrate. Components may be soldered onto the PCB to both electrically connect and mechanically fasten them to it. PCBs may be single-sided (one copper layer), double-sided (two copper layers on both sides of one substrate layer), or multi-layer (outer and inner layers of copper, alternating with layers of substrate). Multi-layer PCBs allow for higher component density, because circuit traces on the inner layers free up surface space between components. Multilayer PCBs may include two, three, four, or more copper planes (layers for traces). (Search "printed circuit board" on Wikipedia.com May 22, 2020. Modified. Accessed Jun. 4, 2020.)

The uniform memory die 102 may for example be memory die such as 2D NAND flash memory or 3D BiCS (Bit Cost Scaling), V-NAND or other 3D flash memory, but other types of die or integrated circuit may be used. These other types of semiconductor die include but are not limited to controller die such as an ASIC, or RAM such as an SDRAM, DDR SDRAM, LPDDR and GDDR.

The uniform memory die 102 or integrated circuit may include a number of die bonding pads 104 along an edge of the semiconductor die. A number of die may be combined into a package. Each die bonding pad may be referred to herein as a channel, with a first die bonding pad on each die arbitrarily referred to as the first channel, a second die bonding pad on each die arbitrarily referred to herein as the second channel, and so on for the remainder of the die bonding pads 104 on the integrated circuit or uniform memory die 102. In embodiments explained below, each of the first channel die bonding pads on the die of a package may be connected to each other and a printed circuit board (PCB) or other substrate, each of the second channel die bonding pads on die may be connected to each other and the substrate, and so on across the die bonding pads 104 of an integrated circuit or uniform memory die 102.

Figure 2:
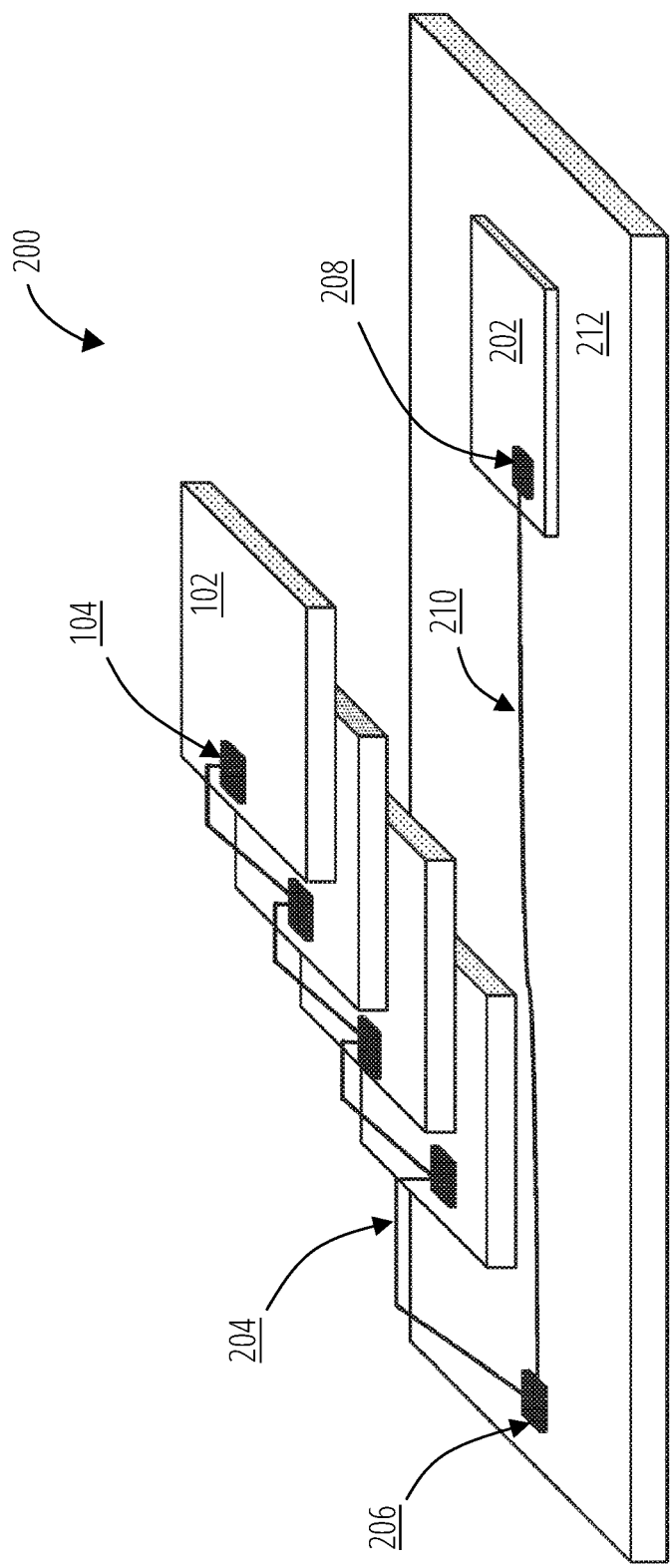
FIG. 2 is a schematic representation of a memory package of four memory die with an on-board memory controller.
Figure 3:
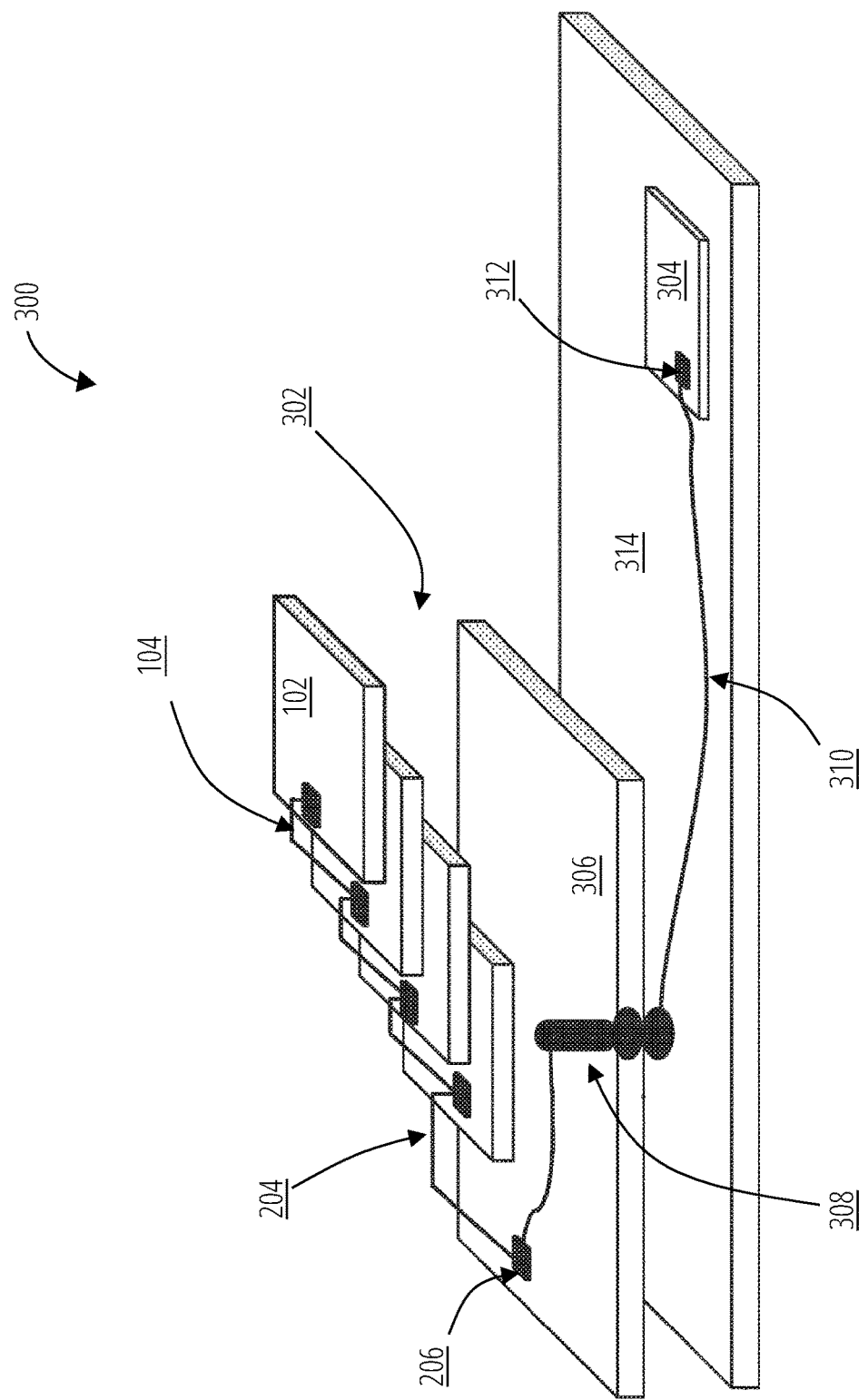
FIG. 3 is a schematic representation of a memory package attached on a printed circuit board with an external memory controller.

FIG. 2 and FIG. 3 illustrate embodiments of a number of memory die combined into a package, where the die bonding pads of the die in the package are connected by a set of wire bonds serving as transmission lines between memory die. Together the memory die of one more or packages may be combined with a memory controller into a memory system, with the wire bonding interconnecting these elements serving as the system bus.

FIG. 2 is a schematic representation of a memory package 200 of four uniform memory die 102, such as a 3D NAND memory structure, on a printed circuit board 212. The uniform memory die 102 are stacked one on another, offset somewhat to expose the die bonding pads 104 along the edge of the uniform memory die 102 so that these pads may be connected wire bonds 204. To simplify the figure, a single bonding pad connected by a single wire bond channel is shown for each uniform memory die 102, but where an embodiment may have several (e.g. 8) such bus lines or channels, they may form a system bus.

The stack of the uniform memory die 102 are attached to the printed circuit board 212 which includes a bonding pad 206. In the embodiment of FIG. 2, the memory package 200 includes an on-board memory controller 202 (e.g., ASIC). The memory controller 202 includes a set of bonding pads, one of which is shown as bonding pad 208, that is also connected to the board's bonding pad 206 along a transmission line 210 that includes a section of, for example, around 5 mm in length of a conductor in a typical arrangement. The memory package 200 of FIG. 2 may, for example, be a memory card or one of a number of packages forming a solid state drive (SSD).

FIG. 3 is a schematic representation of an embodiment for a memory system 300 in which a package 302 of a number of uniform memory die 102 does not include an on-board controller, but where one or more such packages 302 are attached to a printed circuit board 314 that includes an external memory controller 304 (e.g., ASIC) that is connected to the one or more memory packages 302. The memory package 302 is formed similarly to memory package 200 of FIG. 2 but may not include an on-board controller on the package board 306. The wire bonds 204 are again connected to a bonding pad 206 on the package board 306, but instead of connecting an on-board controller ASIC, a transmission line 310, typically around 50 to 100 mm long, on package board 306 is connected to a via 308 or other connection to form a part of a transmission line 310 that is formed on printed circuit board 314 and that connects to the bonding pad 312 of memory controller 304. In one embodiment, the memory controller 304 is an external controller is not formed as part of the memory package 302 but is rather on the printed circuit board 314. Although a single memory package 302 is shown in FIG. 3, the memory system may include a number of such packages 302 connected to a single printed circuit board 314. A printed circuit board 314 with one or more memory packages attached may be part of a solid state drive (SSD), for example, that may include many such PCBs as sub-components. Other additional integrated circuits and other elements may be incorporated into the memory package 200, the package 302, included on the printed circuit board 314, or each of these.

The wire bonds 204 form transmission lines connecting the different integrated circuits (uniform memory die 102, memory controller 202, and memory controller 304), the printed circuit board 212 and package board 306, and the printed circuit board 314 end or terminate at a bonding pad. Electrical termination is the practice of ending a transmission line with a device that matches the characteristic impedance of the line, whether for the wire bonds 204 or transmission lines (e.g., transmission line 210 and transmission line 310) connecting other integrated circuits or electrical components.

"Electrical termination", "termination" or "signal termination" refers to the practice of ending a transmission line with a device that matches the characteristic impedance of the line. This is intended to prevent signals from reflecting at the end of the transmission line. Reflections at the ends of unterminated transmission line cause distortion which may produce ambiguous digital signal levels and mis-operation of digital systems. (Search "electrical termination" on Wikipedia.com Jul. 23, 2018. Modified. Accessed Jun. 5, 2020.)

There are two types of electrical termination, passive or resistive termination and active termination. Passive electrical termination is a circuit that includes a passive electrical component such as a resistor or a set of resistors connected in parallel. Active electrical termination is a circuit that includes an active electrical component such as a transistor or a set of transistors configured to perform electrical termination for an input signal.

"Transistor" refers to an electronic component configured to serve as a signal amplifier or as an electronic switch. A transistor comprises a gate terminal, a source terminal, a drain terminal, and a body terminal or just a body.

A transistor may comprise a discrete electronic or semiconductor component or may comprise structures or portions of structures or devices embedded in an integrated circuit or semiconductor component or semiconductor device. A transistor operating as a switch is configured such that the source terminal electrically connects to a first electrical structure and the drain terminal electrically connects to a second electrical structure.

In a switch configuration, a gate terminal of the transistor connects to a control line. The transistor is activated by increasing a voltage on the control line coupled to a gate terminal of the transistor to, or above, a threshold voltage and deactivated by decreasing the voltage on the control line below a threshold voltage. Activation of a transistor by way of the control line is referred to herein as placing the transistor in an on state. Activation of the transistor forms an electrically conductive path and/or causes the transistor to conduct a current and/or permit a voltage, or bias, to transfer between the source terminal and the drain terminal.

"Characteristic impedance" refers to a ratio of the amplitudes of voltage and current of a single signal wave propagating along the line; that is, a wave travelling in one direction in the absence of reflections in the other direction. Characteristic impedance (usually written Zo) is typically defined in relation to a uniform transmission line. Alternatively, and equivalently, characteristic impedance may be defined as the input impedance of a transmission line when the transmission line's length is infinite. Characteristic impedance is determined by the geometry and materials of the transmission line and, for a uniform transmission line, is not dependent on the uniform transmission line's length. The SI unit of characteristic impedance is the ohm.

The characteristic impedance of a lossless transmission line is purely real, with no reactive component. Energy supplied by a source at one end of such a line is transmitted through the line without being dissipated in the line itself A transmission line of finite length (lossless or lossy) that is terminated at one end with an impedance equal to the characteristic impedance appears to the source like an infinitely long transmission line and produces no reflections. (Search "characteristic impedance" on Wikipedia.com May 17, 2020. Modified. Accessed Jun. 2, 2020.) "Input impedance" refers to an impedance that exists on an input node when a circuit is active. "Input node" refers to a node in a circuit where an input signal is applied to the circuit.

The termination is intended to prevent signals from reflecting off the end of the transmission line. Reflections at the ends of unterminated transmission lines may cause distortion that may produce ambiguous digital signal levels and mis-operation of digital systems. Reflections in analog signal systems cause such effects as video ghosting, power loss in radio transmitter transmission lines, or data logic signal errors.

Signal termination often involves the inclusion of a termination circuit at the beginning, somewhere in between, and/or at the end of a wire or cable to prevent a signal from being reflected back from each end, causing interference, or power loss.

Depending on the embodiment, the termination may be placed at the end of a transmission line or on the various elements connected along a communication bus and is designed to match the Alternating Current (AC) impedance of the cable and hence mitigate signal reflections and power losses. In some embodiments, a termination circuit may also be placed at the driving end of the wire or cable.

For example, in the embodiments represented in FIG. 2 and FIG. 3, each of the uniform memory die 102 may include termination, or termination may be limited to the end most memory die (the top uniform memory die 102 of the stack as represented in either of FIG. 2 or FIG. 3). As the memory die of a device will often be of the same design, a termination circuit may be included for each of the bonding pads of the memory die(s). In some embodiments, the termination circuit may be active on a memory die when the memory die is active. In other embodiments, the termination on the end most memory die along the system bus may provide termination for whichever of the memory die are active, with the other memory die's termination circuits not being active.

For many systems, a passive resistive termination is used using resistors or a combination of MOSFET switches for programmability, with a value programmed to match the characteristic impedance of the transmission line, and chosen to have acceptably low parasitic inductance and capacitance at the frequencies relevant to the system. Depending on the application, the signal on the transmission line being terminated may be an analog signal or a digital signal. In many integrated circuit applications, the analog signals being terminated will often be on the order of tens or hundreds of millivolts. For the primary embodiments discussed here, such as a communication bus on a non-volatile memory system, the main application may be for digital signals having a relatively large voltage level spread between the low and high logic levels, such as ~1.5V or, more generally in the range of 1V to 5V or even higher.

"Logic level" refers to one of a finite number of states that a digital signal may inhabit. Logic levels are usually represented by the voltage difference between the signal and ground, although other standards exist. The range of voltage levels that represent each state depends on the logic family being used. In binary logic the two levels are logical high (e.g., high logic level) and logical low (e.g., low logic level), which generally correspond to binary numbers 1 and 0 respectively. (Search "logic level" on Wikipedia.com Apr. 5, 2020. Modified. Accessed Jul. 15, 2020.)

Figure 4:
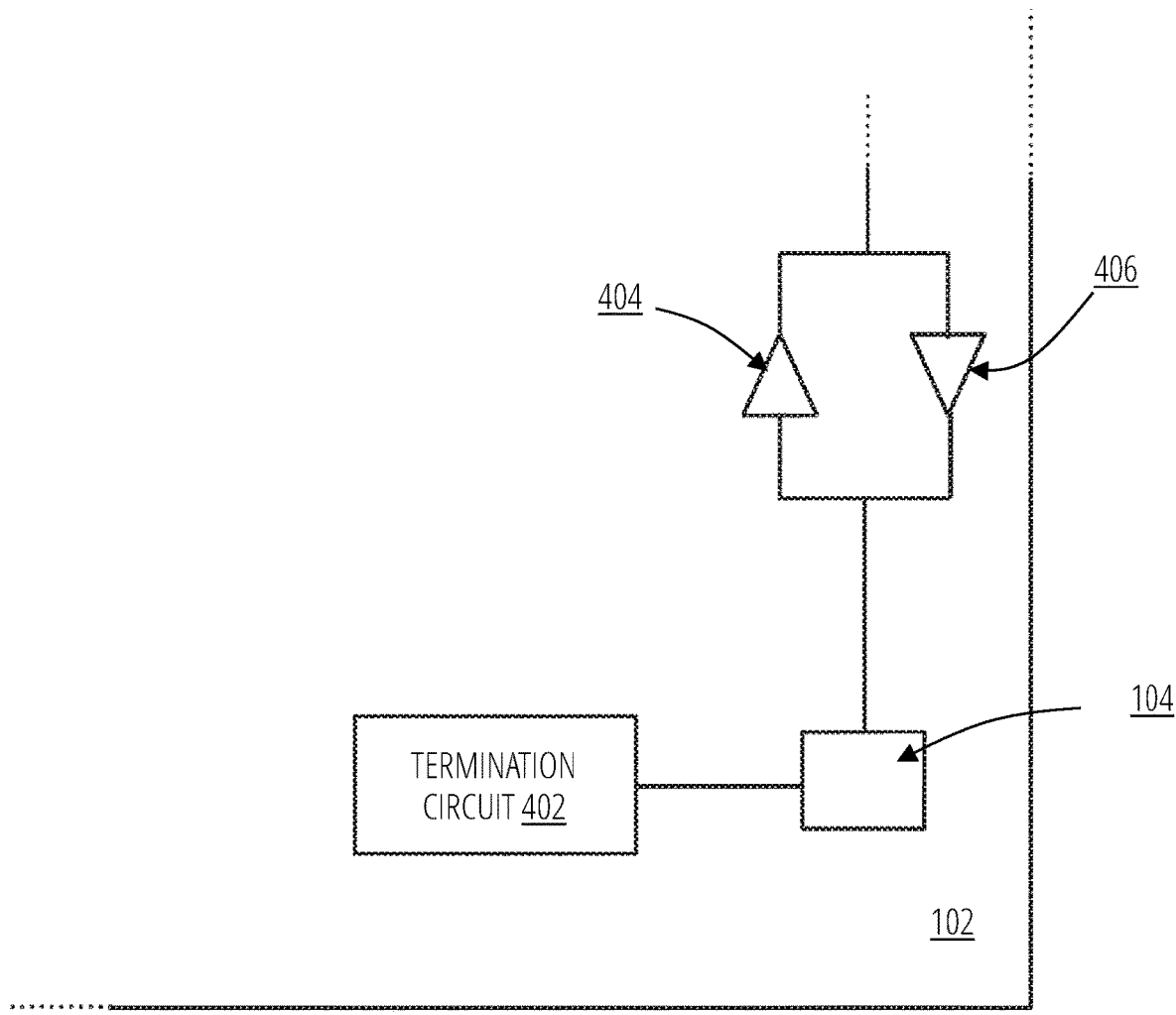
FIG. 4 looks at the inclusion of a termination circuit on an integrated circuit.

FIG. 4 looks at the inclusion of a termination circuit on an integrated circuit, such as a non-volatile memory circuit (e.g., uniform memory die 102). As noted above, although the following discussion is given primarily in terms of the integrated circuits of a non-volatile memory system, the techniques readily apply more generally. More specifically, FIG. 4 shows an edge of a uniform memory die 102 integrated circuit and one of its die bonding pads 104. The die bonding pad 104 is connected to an input driver 404, configured to supply signals received on the bonding pad on to other internal elements of the integrated circuit, and an output driver 406, configured to supply signals from the integrated circuit's other internal elements to the die bonding pad 104 and on to a wire bond (not shown) attached to the die bonding pad 104. In certain embodiments, a termination circuit 402 may also attach to the die bonding pad 104.

Figure 5:
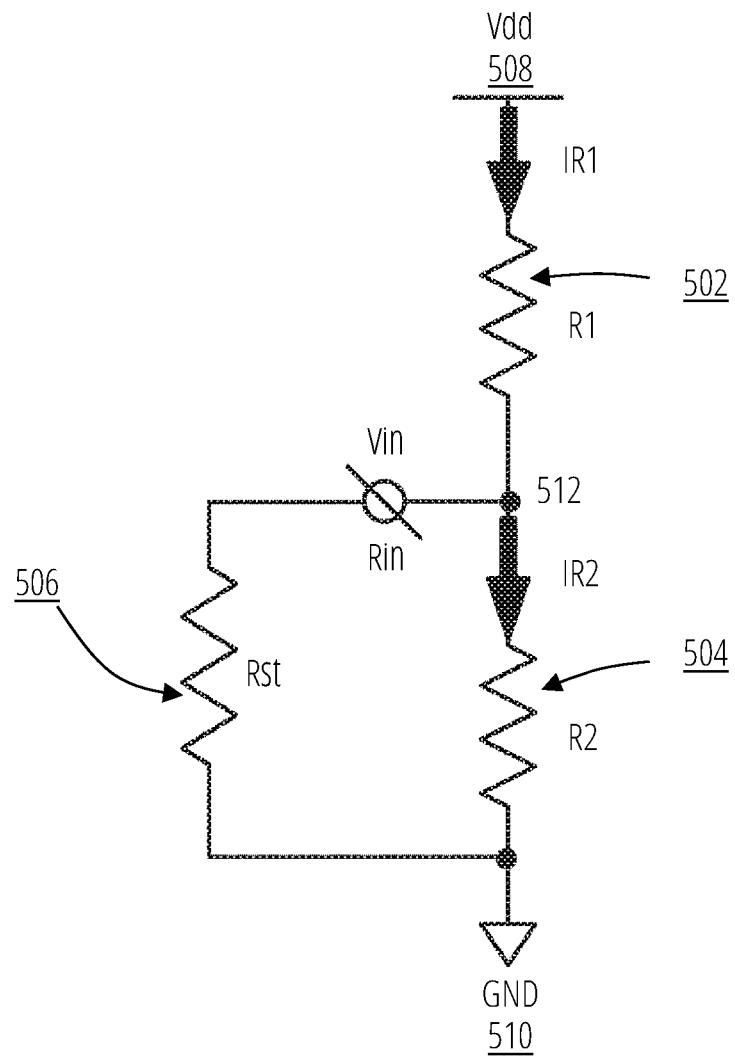
FIG. 5 illustrates an example of a passive termination circuit in accordance with the prior art.

FIG. 5 illustrates an example of a prior art passive termination. The termination circuit is formed of a first resistor RI 502, connected between the high voltage supply 508 level of Vdd and an input node 512, and a second resistor R2 504 connected between the input node 512 and the low voltage supply 510 level, taken here as ground. To provide an input resistance of Rin as seen at the input node 512, the value of the resistances of RI 502 and R2 504 are each taken as 2*Rin. The resistors RI 502 and R2 504 may be implemented as resistors or MOSFETs configured as resistances, for example. The resistance of the attached transmission line is represented as Rst 506, where in the example of the memory packages of FIG. 2 or FIG. 3, this would correspond to the cumulative resistance of a wire bond along the length of the stack of die (or "stack resistance"). FIG. 5 illustrates the connection of Rst 506 corresponding to a low logic state of ground (e.g., low voltage supply 510). In FIG. 5, as well as in subsequent FIG. 7, FIG. 8A to FIG. 8C, and FIG. 10A, the transmission line (transmission line 210 of FIG. 2, transmission line 310 of FIG. 3) between the Rst source controller impedance and the Vin node is not shown.

In such a passive termination circuit, low impedance Rin increases the bandwidth, $1/(2\pi RinC)$, where C is the parasitic capacitance of the signal input or the distributed inputs of a stacked-die. However, using low-resistance passive termination consumes high power, as the resistors RI 502 and R2 504 are in a series connection between the high voltage supply 508 (Vdd) and low voltage supply 510 (ground), so that lowering the value of Rin increases the current flowing in the termination circuit and power consumption of a semiconductor circuit such as a memory die. This may be illustrated with respect to FIG. 6A to FIG. 6C.

Figure 6A:
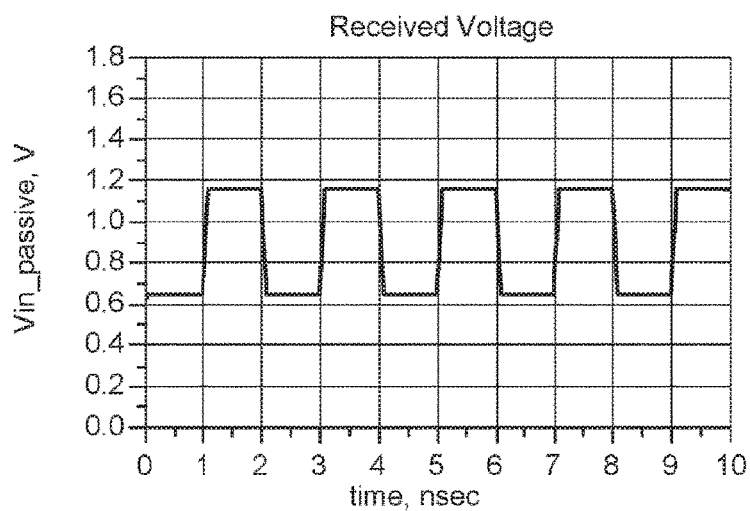
FIG. 6A is a plot of a voltage applied at the input of the passive termination circuit of FIG. 5 and FIG. 6B and FIG. 6C illustrate the current though elements of FIG. 5 in response to the applied voltage of FIG. 6A.
Figure 6B:
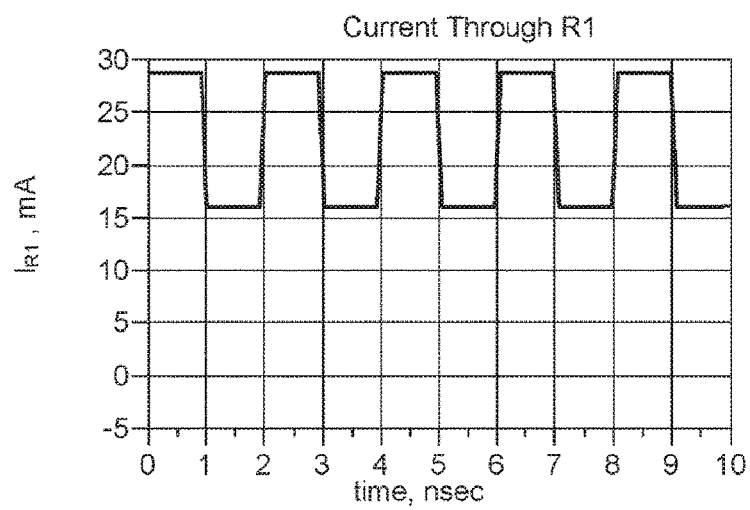
Figure 6C:
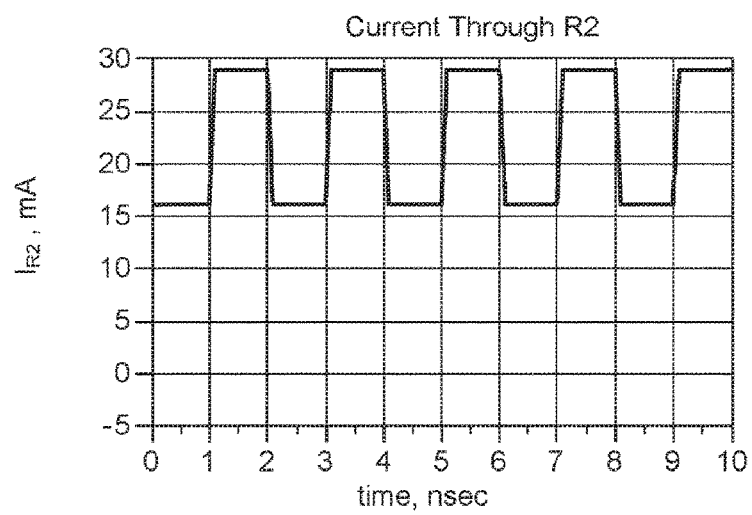

FIG. 6A is a plot of a voltage, Vin_passive, applied at the input of the passive termination circuit of FIG. 5 as a function of time. In this example, the input voltage alternates between a high value of around 1.2V and a low value of a just over 0.6V, with a period of about 2 ns. FIG. 6B and FIG. 6C respectively illustrate the corresponding currents fa1 through RI 501 and fa2 through R2 503 in response to the input waveform of FIG. 6A.

As illustrated in FIG. 6B, when the received input, Vin_passive, is high, the voltage at the node below RI 501 is high, and fa1 is low; and when the received input Vin_passive is low, the voltage at the node below RI 501 is low, and fa1 is high.

As illustrated in FIG. 6C, when the received input, Vin_passive, is high, the voltage at the node above R2 503 is high, and fa2 is high; and when the received input Vin_passive is low, the voltage at the node above R2 503 is low, and fa2 is low. Consequently, fa1 is half a cycle out of phase with Vin_passive and fa2 is in phase. In both cases, though, the low value of fa1 and fa2 are both non-zero, so that there is constantly current flowing through both of RI 501 and R2 503. The graphs of FIG. 6A to FIG. 6C are based on a particular set of values for the period, resistance, and supply levels, so that the graphs will vary according to different implementation values but are illustrative of the general behavior.

To provide low impedance receiver termination at a lower power than resistive termination, this disclosure presents embodiments of a low-power termination architecture that is an active low-power termination (ALPT). As described below, the ALPT architecture system is characterized by lower power/current consumption than passive resistive termination. It may also include a programmable termination impedance.

"Termination impedance" refers to an impedance configured to terminate, mitigate, or stop reflections of a signal on a transmission line. Termination impedance may be expressed in Ohms and may be referred to as a termination resistance and may be present in a sender circuit that sends a signal and/or in a receiver circuit that receives the signal. Where termination impedance is discussed in relation to an input signal coming into a circuit, a termination impedance may also be referred to as an input impedance.

Figure 7:
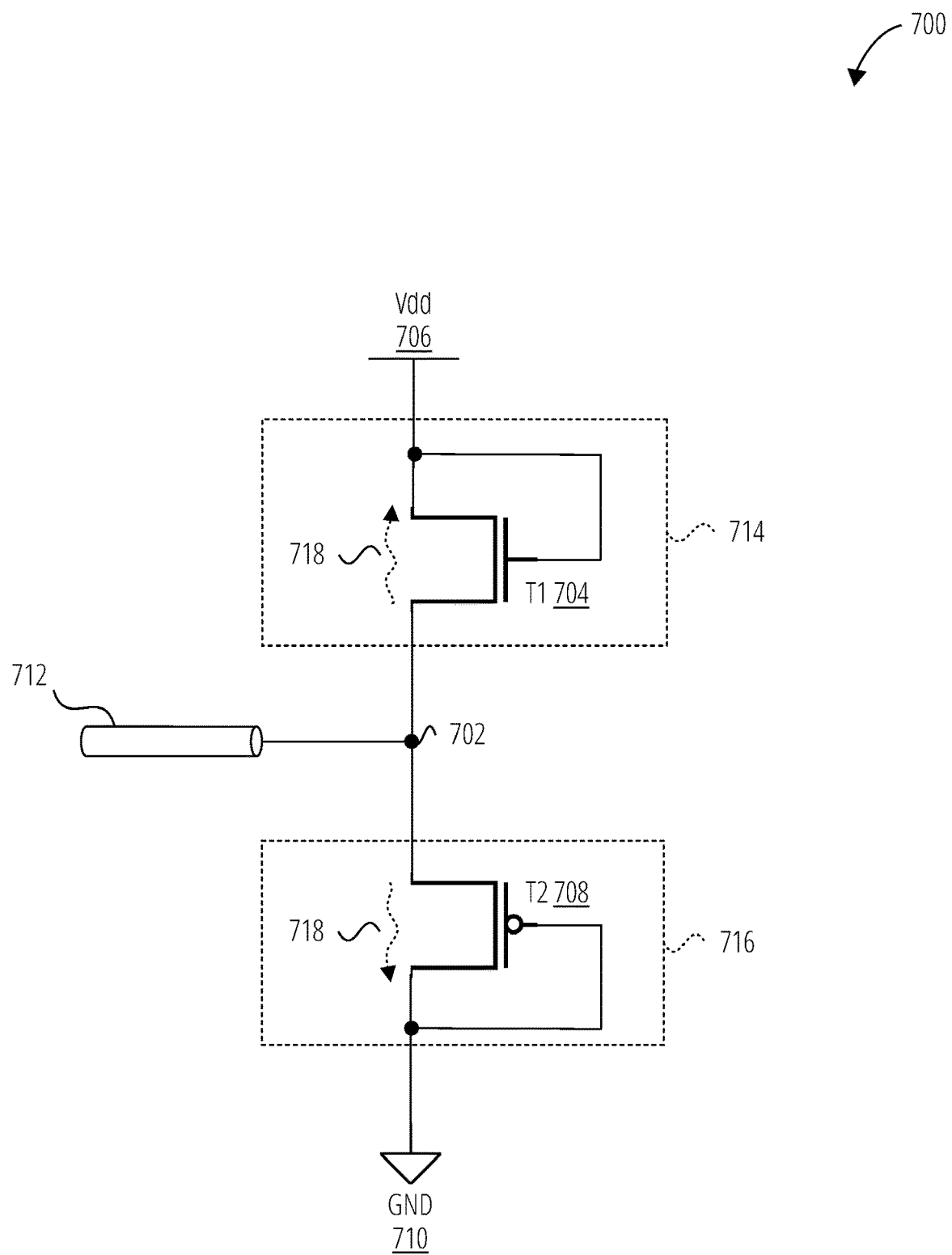
FIG. 7 illustrates an embodiment for an active low-power termination circuit.

FIG. 7 illustrates an active termination circuit 700 that is a first embodiment for an active low-power termination circuit. "Active termination circuit" refers to a circuit configured to provide electrical termination using active electronic components. Typically, an active termination circuit is coupled to a high voltage supply, such as VDD or VCCQ, and a low voltage supply, such as ground. In certain embodiments, an active termination circuit is formed within a common semiconductor die that includes other electronic components and circuits for performing other functions. In such embodiments, the active termination circuit may be referred to as an on-die active termination circuit or an on-die active resistance circuit.

Figure 10A:
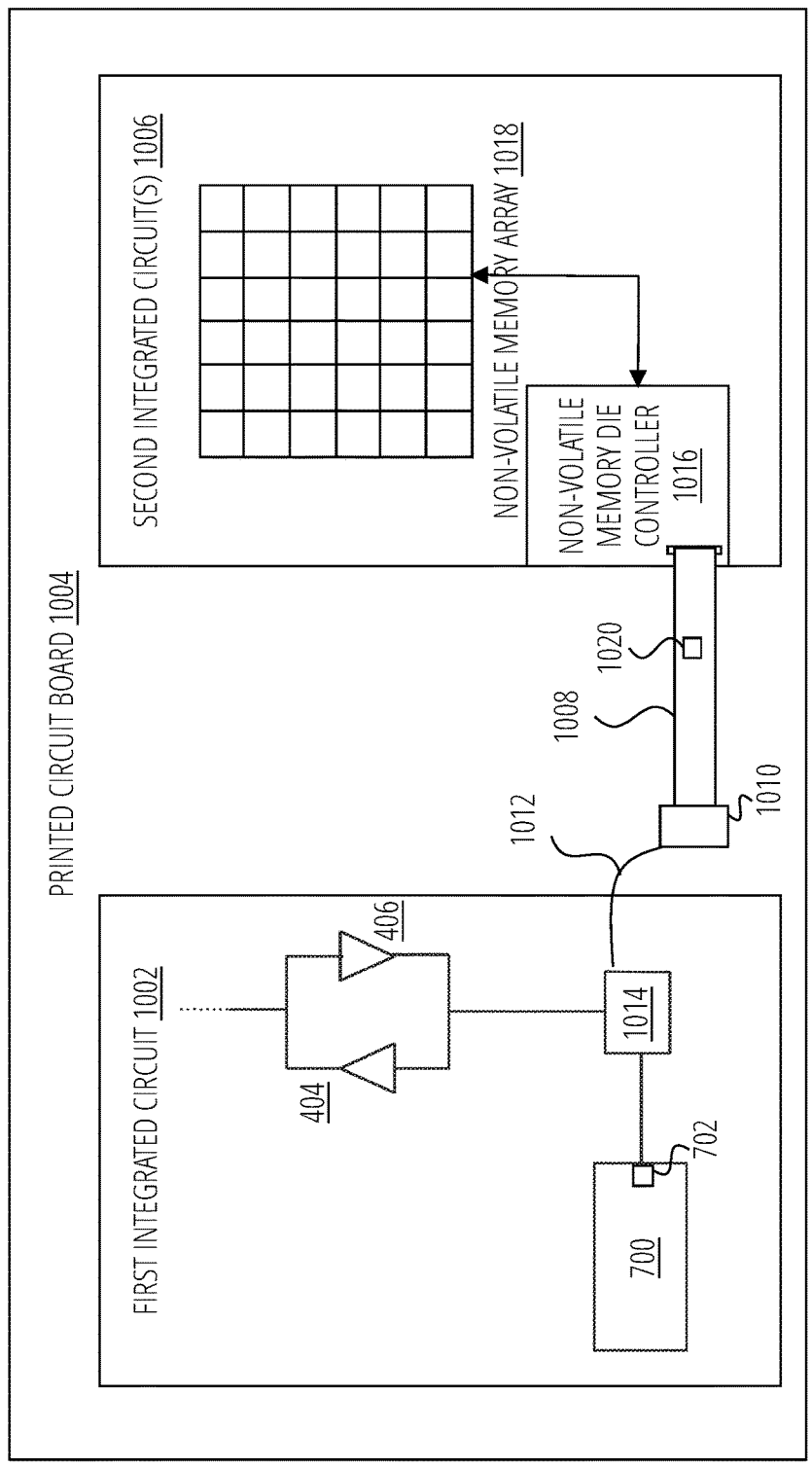
FIG. 10A illustrates another embodiment for an active low-power termination circuit.

Rather than the input of the termination circuit being received between a pair of series connected passive resistors as in FIG. 5, in an active termination the input is received between a pair of active electronic components. In FIG. 7, the input for the termination is received at an input node 702 between a first transistor TI 704, connected between a high voltage supply 706 (Vdd) and the input node 702, and a second transistor T2 708, connected between the input node 702 and a low voltage supply 710 (ground). In the embodiment illustrated in FIG. 7, the first transistor TI 704 may be implemented as an NMOS transistor and the second transistor T2 708 may be implemented as a PMOS transistor. Although the active low-power termination with inherent bias (ALPTib) described here, such as the embodiments illustrated with respect to FIG. 7 and FIG. 10A, are mainly described with respect to use on the integrated circuits of a non-volatile memory system, the techniques are applicable to other bus lines requiring low power and lower impedance for higher bandwidth.

"NMOS transistor" or "n-channel MOS FET transistor" refers to a three terminal active electronic component configured to operate as a transistor and is a type of metal-oxide-semiconductor insulated gate field-effect transistor having an n-channel. An NMOS transistor operates in complementary manner to a PMOS transistor.

"PMOS transistor" or "p-channel MOS FET transistor" refers to a three terminal active electronic component configured to operate as a transistor and is a type of metal-oxide-semiconductor insulated gate field-effect transistor having an p-channel. A PMOS transistor operates in complementary manner to an NMOS transistor.

Both first transistor T1 704 and second transistor T2 708 are diode connected, with the control gate of first transistor T1 704 connected to high voltage supply 706 and the control gate of second transistor T2 708 connected to low voltage supply 710. The voltage level at the input node 702 will vary with the signal on the line being terminated. This helps to provide a termination capability that has a number of advantages when terminating lines carrying digital signals, as described further below with respect to FIG. 8A to FIG. 8C, FIG. 9A to FIG. 9C, and FIG. 11.

The termination circuit of FIG. 7 is a "bolt-on" embodiment of an active termination circuit, in that it may be incorporated to provide termination in already existing circuit designs as it is designed to work with existing logic inputs and outputs. This allows for use of a predefined logic mask (i.e., acceptance of the existing voltage range). The design of FIG. 7 also has the advantage of implementing one node attachment. As described further below with respect to FIG. 8A to FIG. 8C and FIG. 9A to FIG. 9C, the design of FIG. 7 may draw less power than a passive termination circuit and, as described further below, and may be tuned and calibrated so that the circuit's CMOS sizes will be balanced to match the different logic states and processes.

The termination circuit of FIG. 7, where first transistor T1 704 and second transistor T2 708 are connected is series between high voltage supply 706 (Vdd) and low voltage supply 710 (ground), acts as a push-pull circuit with respect to the input node 702. Push-pull circuits are typically used for amplifier outputs. In bipolar designs, a push-pull circuit is an emitter follower. In a CMOS design, as in FIG. 7, the push-pull circuit is a source follower. In a source follower circuit, the source follower's impedance level is determined by the transconductance of the transistors. The transconductance for a source follower is determined by the device size and current, along with other CMOS technology parameters (e.g. the oxide thickness, Tox) that also contribute to determining the transconductance. As discussed below after the discussion of FIG. 10A, the termination circuits of FIG. 7 and FIG. 10A may be calibrated to adjust the effective device sizes to account for variations in processing and the designed impedance of the transmission line 712. This transconductance facilitates the inherent bias 718 current that may permit this solution to operate at lower power consumption than conventional solutions.

The termination circuit of FIG. 7 utilizes this push-pull configuration as an input. For use in a memory system in which the wire bonds are used as a communication bus for the uniform memory die 102 and memory controller 202 or memory controller 304, as illustrated in FIG. 2 or FIG. 3, the signals being terminated will be digital signals having either a low logic value (e.g., ground), a high logic value (e.g., Vdd), or which are in a transitional stage between the two. The logic low, transition, and high will create different operating conditions and are respectively illustrated with respect to FIG. 8A, FIG. 8B, and FIG. 8C.

In sum, the active termination circuit 700 of FIG. 7 comprises an input node 702 connected to a transmission line 712 configured to supply a signal to the input node 702. The active termination circuit 700 further comprises a first transistor T1 704 diode connected between a high voltage supply 706 and the input node 702, configured to terminate the signal in response to the signal being at a low logic level. The active termination circuit 700 also comprises a second transistor T2 708 diode connected between the input node 702 and a low voltage supply 710 and configured to terminate the signal in response to the signal being at a high logic level.

In one embodiment, the active termination circuit 700 may have at least one of the first transistor T1 704 and the second transistor T2 708 calibrated to provide a termination impedance to the signal on the transmission line 712 within a target input impedance range based on a temperature range that the active termination circuit 700 is configured to operate in. "Target input impedance range" refers to a range of impedance that spans from a low value to high value within which an input impedance is desired or designed or configured to stay.

In one embodiment, the active termination circuit 700 may have a first transistor T1 704 comprising an NMOS transistor and a second transistor T2 708 comprising a PMOS transistor. In another embodiment, the first transistor T1 704 may comprise an NPN bipolar transistor and the second transistor T2 708 may comprise a PNP bipolar transistor, and the high voltage supply 706 may be less than or equal to 1.4 volts.

"NPN bipolar transistor" refers to a type of bipolar transistor which is a three terminal device and the emitter is negatively doped, the base is positively doped, and the collector is negatively doped. "PNP bipolar transistor" refers to a type of bipolar transistor which is a three terminal device and the emitter is positively doped, the base is negatively doped, and the collector is positively doped.

Figure 8C:
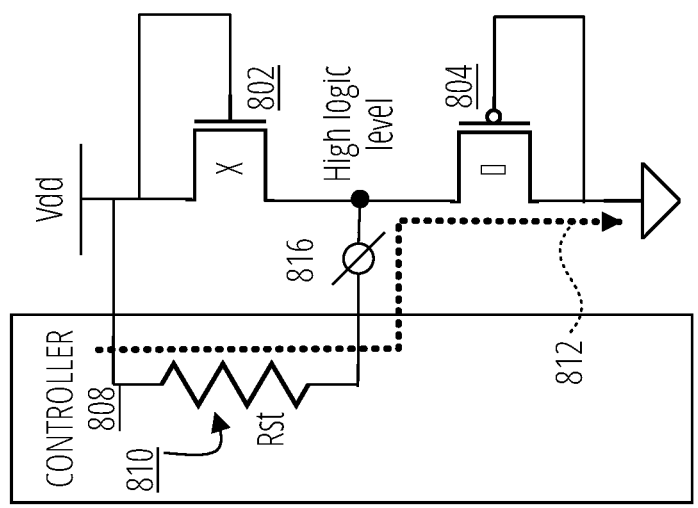
FIG. 8A, FIG. 8B, and FIG. 8C respectively illustrate the behavior of the embodiment of the active termination circuit of FIG. 7 for low logic, transition, and high logic input levels.
Figure 8B:
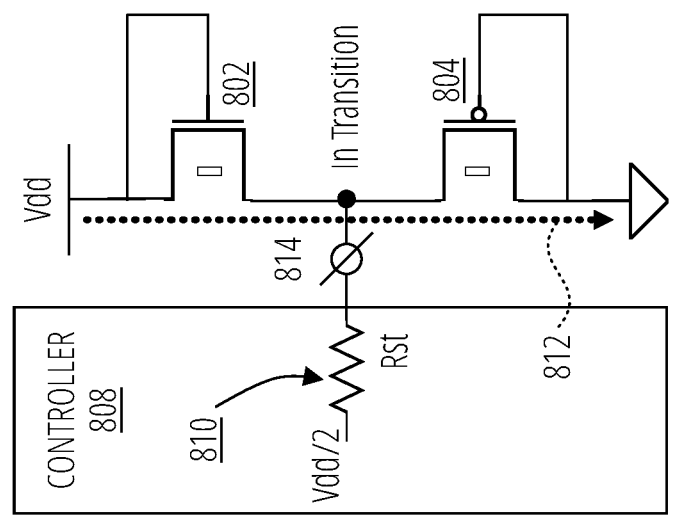
Figure 8A:
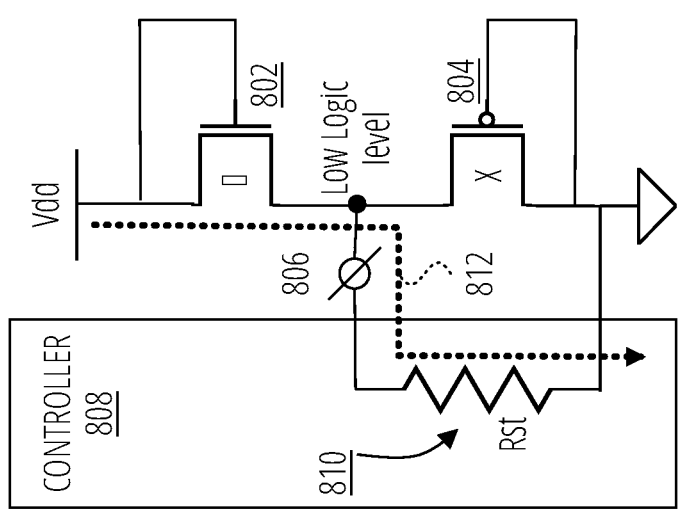

In each of FIG. 8A, FIG. 8B, and FIG. 8C, the input push-pull elements NMOS transistor T1 802 and PMOS transistor T2 804 are shown from the termination circuit of FIG. 7. The input node of the push-pull elements is connected to the transmission line, such as by way of a wire bond of one line or channel of a communication bus connecting a termination circuit on a memory die to a controller 808. The source termination impedance of the controller is represented as the resistance Rst 810.

FIG. 8A looks at the input node at low logic level 806 case, when the signal from the controller 808 is at a logic low value of ground. In this situation, the input node of the termination circuit is consequently connected to ground though Rst 810. The current 812 may mainly come from Vdd through NMOS transistor T1 802, which may operate in its saturation region 818, and PMOS transistor T2 804 may be largely non-conductive, while operating in its cut-off region 820, as illustrated.

"Saturation region" or "active region" refers to a state or operating mode of a transistor in which a current flows between a source terminal and drain terminal of the transistor. A MOSFET transistor in the saturation region has a gate terminal voltage greater than the threshold voltage of the transistor. In circuits where the transistor is operating as a switch, the transistor is considered to be turned 'on' when in the saturation region.

"Cut-off region" or "subthreshold region" refers to a state or operating mode of a transistor in which a current does not flow, no conduction, between a source terminal and drain terminal of the transistor. A MOSFET transistor in the cut-off region has a gate terminal voltage equal to or less than the threshold voltage of the transistor. In circuits where the transistor is operating as a switch, the transistor is considered to be turned 'off' when in the cut-off region.

An inherent bias on the terminals of NMOS transistor T1 802 and PMOS transistor T2 804 (similar to the inherent bias 718 shown for the first transistor T1 704 and second transistor T2 708 introduced in FIG. 7) may allow each transistor to operate alternately within the saturation region 818 and cut-off region 820 as the signal transitions between the low logic level and high logic level. The NMOS transistor T1 802 and PMOS transistor T2 804 may be calibrated to provide a dynamic termination impedance to the signal on the transmission line within a target input impedance range, wherein the dynamic termination impedance changes as the signal transitions between the low logic level and the high logic level.

FIG. 8B looks at the case of the input node transitioning 814 between logic states, when the signal from the controller 808 is changing either from low to high or high to low. In this situation, the voltage level applied to the line is passing through the intermediate value of Vdd/2. The input node of the termination circuit is consequently connected though Rst 810 to levels passing though Vdd/2. In this situation, the voltage level from the input line being terminated will be at, or near, the voltage level on the input node. Current in the termination circuit will flow through both of NMOS transistor TI 802 and PMOS transistor T2 804, which will both be operating in their saturation region 818.

FIG. 8C looks at the case of input node at high logic level 816, when the signal from the controller 808 is at a logic high value of Vdd. In this situation, the input node of the termination circuit is consequently connected to Vdd though Rst 810. The current in the termination circuit will mainly flow to ground from Vdd through PMOS transistor T2 804, operating in its saturation region 818, and NMOS transistor TI 802 will be largely non-conductive, operating in its cut-off region 820.

Advantageously, in certain embodiments, as the signal changes levels between low logic level and high logic level sufficient termination impedance, also referred to as dynamic termination impedance is provided. In one embodiment, in response to the signal having the low logic level, a first transistor, such as NMOS transistor T1 802, operates in a saturation region and a second transistor, such as PMOS transistor T2 804, operates in a cut-off region. Similarly, in response to the signal having the high logic level, a second transistor, such as PMOS transistor T2 804, operates in a saturation region and a first transistor, such as NMOS transistor T1 802, operates in a cut-off region.

In certain embodiments, in between the states shown in FIG. 8B and FIG. 8C and FIG. 8A and FIG. 8C one of the transistors (e.g., NMOS transistor T1 802 and/or PMOS transistor T2 804) may transition from the saturation region 818 to the cut-off region 820, but may not completely enter the cut-off region. Such a state is referred to herein as a "partially off" state. One of the NMOS transistor T1 802 and/or PMOS transistor T2 804 and in a "partially off" state may provide added termination impedance for the input signal.

Figure 9A:
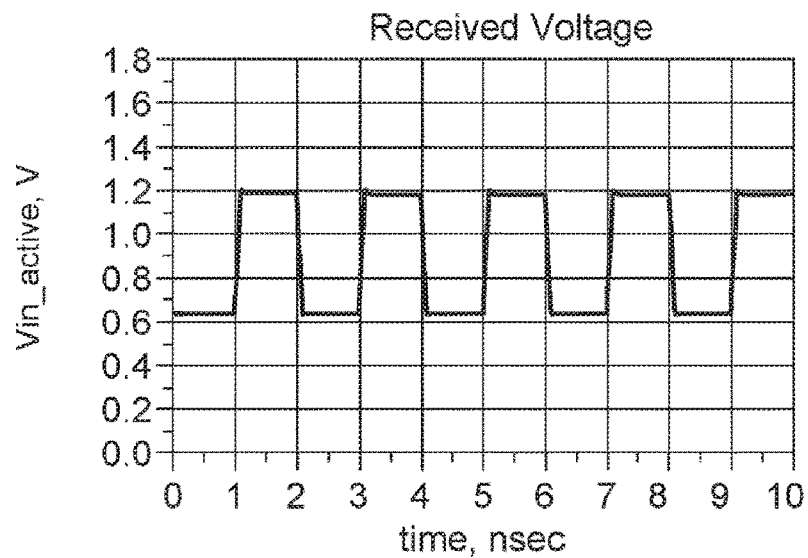
FIG. 9A is a plot of a voltage applied at the input of the active termination circuit of FIG. 7 and FIG. 9B and FIG. 9C illustrate the current though elements of FIG. 7 in response to the applied voltage of FIG. 9A.
Figure 9B:
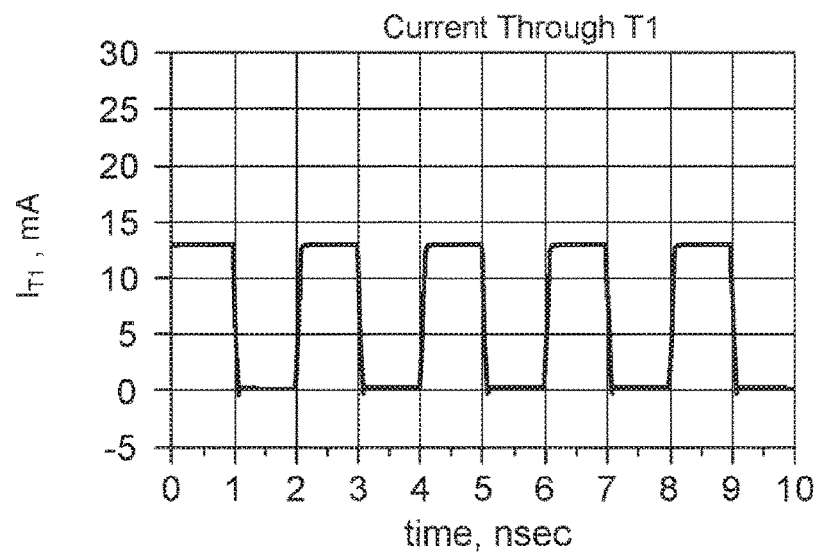
Figure 9C:
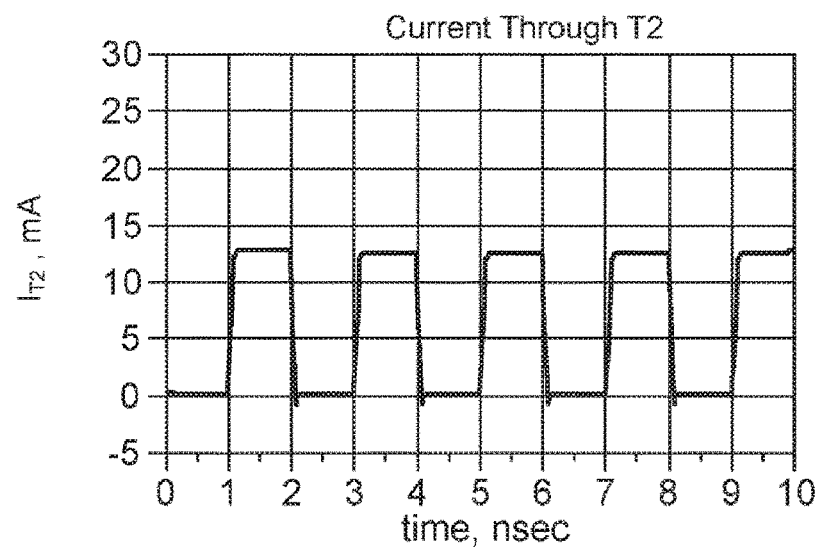

FIG. 9A, FIG. 9B, and FIG. 9C respectively illustrate voltage applied at the input node 702 in FIG. 7, and the current flowing in first transistor T1 704 and second transistor T2 708 in response. As such, FIG. 9A, FIG. 9B, and FIG. 9C are the active low-power termination counterparts of FIG. 6A, FIG. 6B, and FIG. 6C for the passive termination of FIG. 5. More specifically, FIG. 9A is a plot of a voltage Vin_active applied at the input of the active termination circuit 700 of FIG. 7 as a function of time. In this example, as in FIG. 6A, the input voltage alternates between a high value around 1.2V (corresponding to FIG. 8C), and a low value of a just over 0.6V (corresponding to FIG. 8A), with a period of about a 2 ns. FIG. 9B and FIG. 9C respectively illustrate the corresponding currents $I_{T1}$ through first transistor T1 704 and $I_{T2}$ through second transistor T2 708 in response to the input waveform of FIG. 9A.

As illustrated in FIG. 1 9B, when the received input Vin_active is high (corresponding to a high logic state as in FIG. 8C), the voltage at the input node 702 is high, the current path is through Rst 810 to second transistor T2 708 to ground, and $I_{T1}$ is low; and when the received input Vin_passive is low (corresponding to a low logic state as in FIG. 8A), the voltage at the input node 702 is low, the current path is from Vdd though first transistor T1 704 to Rst 810 and to ground, and $I_{T1}$ is high and $I_{T2}$ is low.

As illustrated in FIG. 9C, when the received input Vin_active is high, the voltage at the input node 702 is high, second transistor T2 708 is on, and $I_{T2}$ is high; and when the received input Vin_passive is low, the voltage at the input node 702 is low, second transistor T2 708 is off, and $I_{T2}$ is low. Consequently, $I_{T1}$ is half a cycle out of phase with Vin_active and $I_{T2}$ is in phase, similar to the fa1 and fa2 behavior of FIG. 6B and FIG. 6C. Unlike the passive termination of case illustrated FIG. 6B and FIG. 6C, however, the low current levels for both of $I_{T1}$ and $I_{T2}$ are at or near zero, with the high values moved down a corresponding amount as well. As may be seen by comparing FIG. 6B and FIG. 6C with FIG. 9B and FIG. 9C, the combined currents of $I_{T1}$ and $I_{T2}$ are reduced to about a ½ of the combined currents of fa1 and fa2, resulting in a significant saving of power. As with FIG. 6A to FIG. 6C, the graphs of FIG. 9A to FIG. 9C are based on a particular set of values for the period, resistance, and supply levels, so that the graphs will vary according to different implementation values; however, both sets of figures are based on the same set of assumptions and are comparable for illustration of relative power savings.

FIG. 10A illustrates a system 1000a implementing the active termination circuit 700 introduced in FIG. 7. The system 1000a comprises a first integrated circuit 1002 mounted on a printed circuit board 1004 and a second integrated circuit(s) 1006 mounted on the printed circuit board 1004. An interconnect 1008 may be configured to operate as a transmission line, transmitting signals 1020 between the first integrated circuit 1002 and the second integrated circuit(s) 1006. "Interconnect" refers to a structure configured, designed, arranged, engineered, or programmed to convey a signal between a sender and a receiver. The interconnect 1008 connects to a bonding pad 1010 which is connected by way of a wire bond 1012 to a die bonding pad 1014.

An active termination circuit 700 formed within either the first integrated circuit 1002 or second integrated circuit(s) 1006 or both may comprise an input node 702, such as is introduced in FIG. 7, configured to receive signals 1020 through the interconnect 1008.

The active termination circuit 700 may further comprise a first transistor T1 704 and second transistor T2 708, diode connected, and connected in series between a high voltage supply and a low voltage supply, as previously described with respect to FIG. 7. The first transistor T1 704 may be the NMOS transistor T1 802 (See FIG. 8A) and the second transistor T2 708 may be the PMOS transistor T2 804 (also FIG. 8A). The NMOS transistor T1 802 may have its gate terminal and drain terminal each connected to a high voltage supply and its source terminal connected to the input node 702, such that the NMOS transistor T1 802 terminates the signals 1020 in response to the signals 1020 being at a low logic level. The PMOS transistor T2 804 may have its gate terminal and drain terminal each connected to a low voltage supply and its source terminal connected to the input node 702, such that the PMOS transistor T2 804 terminates the signals 1020 in response to the signals 1020 being at a high logic level.

In one embodiment, the NMOS transistor and PMOS transistor of the active termination circuit 700 may be calibrated to provide a dynamic termination impedance to the signal from the interconnect 1008. The dynamic termination impedance may change as the signals 1020 transition between the low logic level and the high logic level. The NMOS transistor and PMOS transistor may comprise an inherent bias that exists as the NMOS transistor and PMOS transistor alternately transition between a saturation region and a cut-off reg10n.

The system 1000a may be embodied with the first integrated circuit 1002 comprising a memory controller, such as, for example, memory controller 304 introduced in FIG. 3, and the second integrated circuit(s) 1006 may be a die such as, for example, uniform memory die 102, including a non-volatile memory die controller 1016 and a non-volatile memory array 1018. "Non-volatile memory" refers to a type of storage or memory device, component, or apparatus that retains stored data when power is turned off or removed from the non-volatile memory. "Die controller" refers to a set of circuits, circuitry, logic, or components configured to manage the operation of a die. In one embodiment, the die controller is an integrated circuit. In another embodiment, the die controller is a combination of discrete components. In another embodiment, the die controller is a combination of one or more integrated circuits and one or more discrete components. In other embodiments, the second integrated circuit(s) 1006 may include similar volatile memory components, such as a volatile memory die controller and a volatile memory array. "Volatile memory" or "volatile memory media" refers to any hardware, device, component, element, or circuit configured to maintain an alterable physical characteristic used to represent a binary value of zero or one for which the alterable physical characteristic reverts to a default state that no longer represents the binary value when a primary power source is removed or unless a primary power source is used to refresh the represented binary value.

Examples of volatile memory media include but are not limited to dynamic random-access memory (DRAM), static random-access memory (SRAM), double data rate random-access memory (DDR RAM) or other random-access solid-state memory. While the volatile memory media is referred to herein as memory media, in various embodiments, the volatile memory media may more generally be referred to as volatile memory. In certain embodiments, data stored in volatile memory media is addressable at a byte level which means that the data in the volatile memory media is organized into bytes (8 bits) of data that each have a unique address, such as a logical address.

The system 1000a may also be embodied as a system 1000b comprising a stack of uniform memory die 102, coupled to each other in series by a set of wire bonds 204. "Stack of uniform memory dies" refers to a group of two or more uniform memory die arranged in a stacked configuration relative to each other. In one embodiment, each member of the group of uniform memory die is positioned directly above or directly below either another uniform memory die or a substrate.

In one embodiment, each uniform memory die of the stack is positioned relative to the others to form a staircase structure, with each uniform memory die being one of the "steps" of the staircase.

An active termination circuit, for example active termination circuit 1024, active termination circuit 1026, active termination circuit 1028, and active termination circuit 1030 may reside within each uniform memory die 102 of the stack. A temperature sensor 1032 may be configured to sense a temperature for one of the first integrated circuit 1002 and/or second integrated circuit(s) 1006, which may, in this embodiment, be a memory controller 304 and one or more of the uniform memory die 102, respectively. "Temperature sensor" refers to a device, component, circuit, system, logic, chip, or circuitry configured to detect, sense, and/or measure a temperature of an object, an apparatus, a circuit, a component, ambient air, and/or the like. One example of a temperature sensor is a semiconductor based temperature sensor which may be fabricated together with the semiconductor.

Figure 10B:
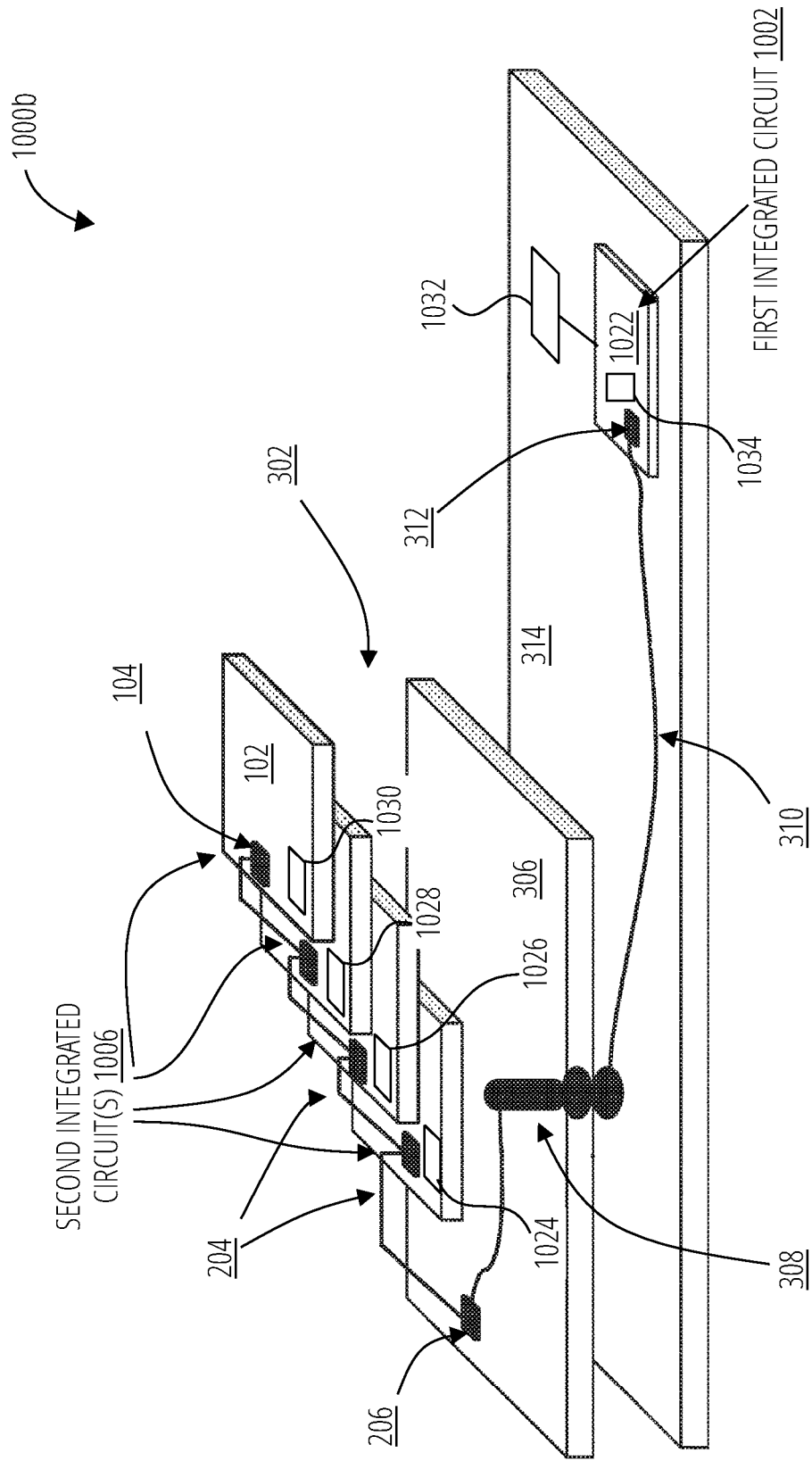
FIG. 10B illustrates an aspect of the subject matter in accordance with one embodiment.

The system 1000b may include a second integrated circuit(s) 1006 embodied as a non-volatile memory die controller 1016 (illustrated in FIG. 10A). In certain embodiments, each uniform memory die 102 may include a non-volatile memory die controller 1016 (not shown in FIG. 10B) that serves as the second integrated circuit(s) 1006 when that uniform memory die 102 communicates with the non-volatile memory storage controller 1022.

The system 1000b may also include a first integrated circuit 1002 embodied as a non-volatile memory non-volatile memory storage controller 1022, similar in many respects to memory controller 304. In other embodiments, the first integrated circuit 1002 may include similar volatile memory components, such as a volatile memory die controller or a volatile storage controller.

The non-volatile memory storage controller 1022 may store a set of calibration settings 1034 for one or more of the first transistor T1 704 (e.g., in embodiments where the first transistor T1 704 comprises one or more NMOS transistors programmatically connectable in parallel) and the second transistor T2 708 (e.g., in embodiments where the second transistor T2 708 comprises one or more PMOS transistors programmatically connectable in parallel). "Storage controller" refers to any hardware, device, component, element, or circuit configured to manage data operations on non-volatile memory media, and may comprise one or more processors, programmable processors (e.g., FPGAs), ASICs, microcontrollers, or the like. In some embodiments, the storage controller is configured to store data on and/or read data from non-volatile memory media, to transfer data to/from the non-volatile memory device(s), and so on.

"Calibration setting" refers to one or more of a setting, value, characteristic, parameter, attribute, or the like, set in order to improve or optimize performance, accuracy, and/or operation of a set of logic, circuit, software, hardware, firmware, system, sub-system, device, apparatus, or logic unit, component, device, or component.

The calibration settings 1034 may calibrate, define, or determine the set of NMOS transistors and/or a set of PMOS transistors serving respectively as the first transistor T1 704 and second transistor T2 708, as needed. For example, as described in more detail in relation to FIG. 12, calibration settings 1034 may define which switches are open and/or which are closed to define the number and type and/or organization of switches for a set of NMOS transistors and/or a set of PMOS transistors.

Active electronic components such as transistors may function differently in different ambient temperatures. Thus, in certain embodiments, the non-volatile memory storage controller 1022 may change the calibration settings 1034 for the NMOS transistor and PMOS transistor in response to the temperature sensor 1032 sensing a temperature below, or above, a temperature threshold. In one embodiment, the non-volatile memory storage controller 1022 may be configured to change calibration settings 1034 for the set of PMOS transistors when a temperature sensed by the temperature sensor 1032 is greater than or equal to about 100° C. and when the temperature is less than or equal to about −25° C.

Figure 10C:
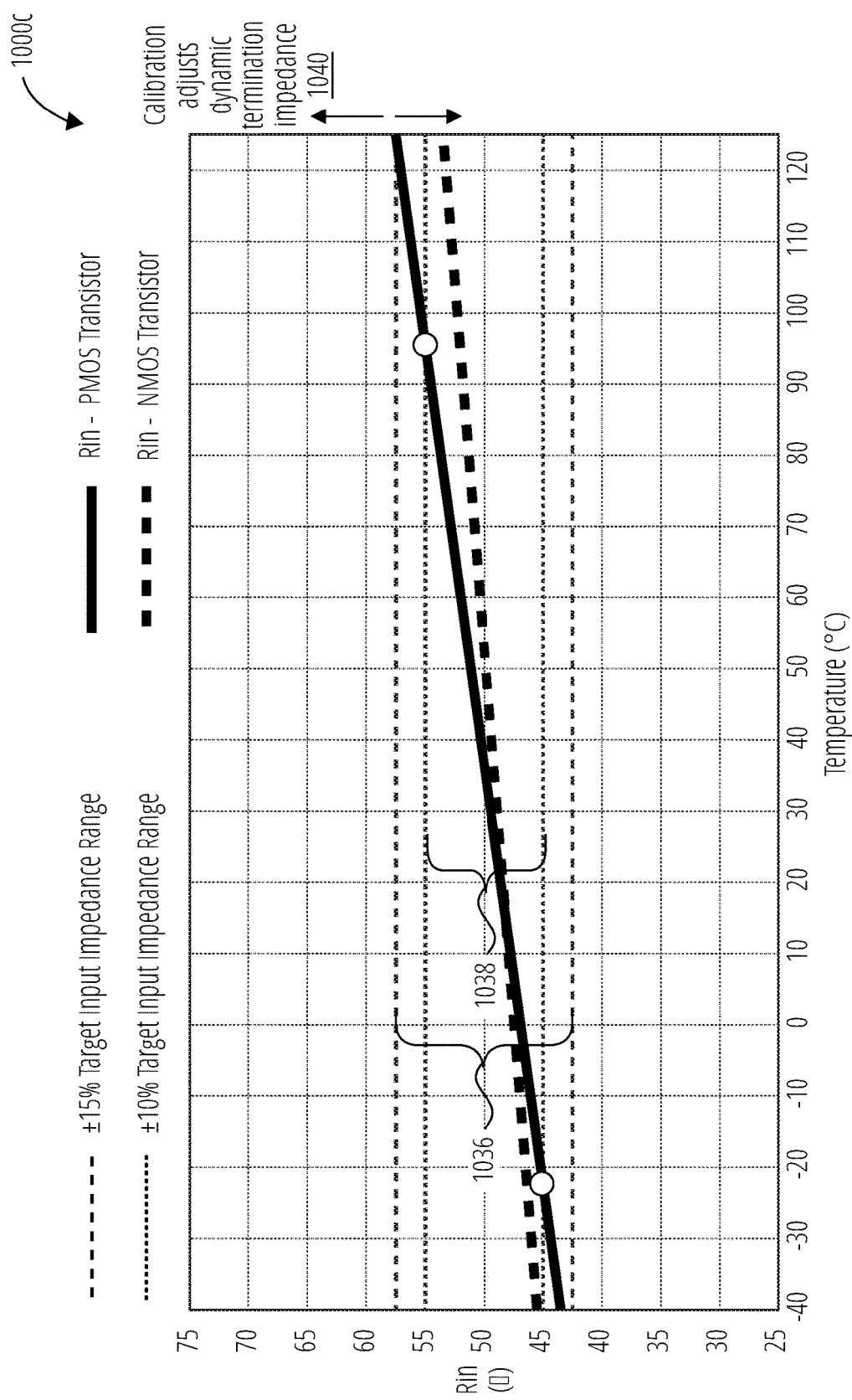
FIG. 10C illustrates an aspect of the subject matter in accordance with one embodiment.

FIG. 10C provides a chart 1000c showing the dynamic termination impedance 1040 (input impedance Rin) across a temperature range. Depending on the application, the NMOS calibration bank 714 and or the PMOS calibration bank 716 may need to provide a predefined input impedance within a target input impedance range. Certain applications may require a ±15% target input impedance range 1036, and others may require a ±10% target input impedance range 1038.

Chart 1000c illustrates that performance of NMOS transistors between −40° C. and 125° C. is within both the ±15% target input impedance range 1036 and ±10% target input impedance range 1038. Thus, no calibration setting may be needed and hence the NMOS calibration bank 714 may comprise a single NMOS transistor. Chart 1000c also illustrates that performance of PMOS transistors for providing input impedance between −40° C. and 125° C. is stays mainly within the ±15% target input impedance range 1036 but falls outside the ±10% target input impedance range 1038 at about −25° C. and 95° C.

Accordingly, calibration settings may be set for a set of switches that connect a plurality of PMOS transistors of the PMOS calibration bank 716 to function as second transistor T2 708, in FIG. 7. When a temperature sensor detects a temperature less than about −25° C. stored calibration settings may be used to re-calibrate the PMOS calibration bank 716. A non-volatile memory storage controller 1022 and/or a die controller may monitor the temperature and change calibration settings as needed.

Figure 11:
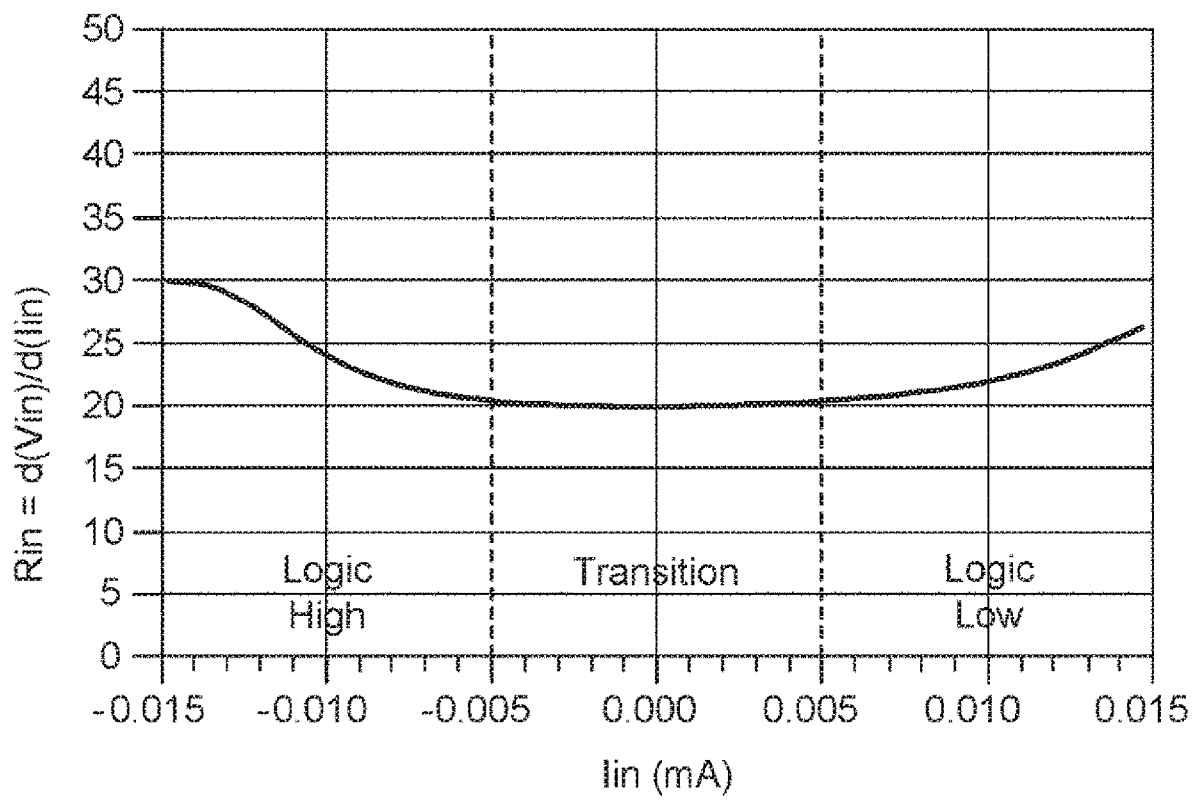
FIG. 11 illustrates a desired behavior of the resistance of the input node as a function of the input current for the active termination circuit of FIG. 7.

FIG. 11 illustrates a desired behavior of the resistance Rin of the input node 702 introduced previously as a function of the current Iin at the input node 702 for the active termination circuit 700 of FIG. 7. The values of Rin and Iin in are related as Rin=d(Vin)/d(Iin). The plot of FIG. 11 has three regions, corresponding to logic low for Iin>0.005 mV, logic high for Iin<−0.005 mV, and the transition region in between. In a digital signal, when the signal is at either of the high or low logic states, the signal is at a steady value ("steady state") and it is not as important that Rin matches the impedance of the transmission line connected to the controller source termination (i.e., Rst 810 in FIG. 8A to FIG. 8C); however, during transition it is desirable that Rin match the line resistance as closely as possible to improve bandwidth. This is illustrated in FIG. 11 where the Rin curve is flat across the central logic state transition range, but curves upwards in the logic low and logic high regions. This is different than the situation for use with an analog signal, where the Rin value is flat across the full signal range. To account for process variation in forming the termination circuit and to set Rin at a target value, the termination circuit may be trimmed.

The active termination circuit of FIG. 7 may be calibrated by trimming the values of one or more of first transistor TI 704 and/or an NMOS calibration bank 714 and second transistor T2 708 and/or a PMOS calibration bank 716. For example, the effective width of the PMOS transistor T2 804 may be varied by selectively connecting a number of PMOS transistors in parallel, as illustrated in FIG. 12.

Figure 12:
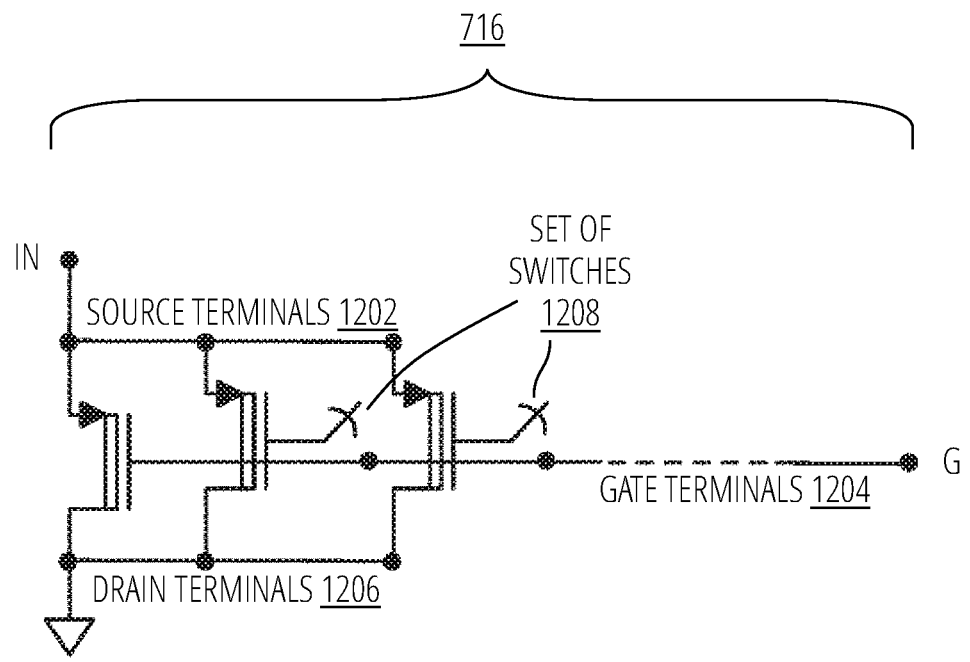
FIG. 12 illustrates using multiple devices to vary the effective width of a device in the embodiment of FIG. 7.

FIG. 12 illustrates the PMOS calibration bank 716 that may comprise the PMOS transistor T2 804 and/or replace the PMOS transistor T2 804 previously discussed. Though not shown, the NMOS calibration bank 714 of FIG. 7 may be similarly arranged, substituting NMOS transistors for the PMOS transistors shown. This configuration may result in a strength of the embodied transistor being configurable by means of setting the various switches into an open state or a closed state based on the calibration setting introduced in FIG. 10B. "Strength" refers to a level of impedance a transistor or set of transistors connected in parallel provide in an active termination circuit.

As illustrated here, PMOS calibration bank 716 may be implemented as multiple devices connectable in parallel between the IN node and ground, with a set of switches 1208 at the gate terminals 1204 for the parallel devices and direct connections for the source terminals 1202 to IN and the drain terminals 1206 to ground. "Gate terminal" refers to a terminal of a transistor that serves as a control terminal for the transistor. Typically, changes in the current or voltage or other bias applied at the gate terminal cause the transistor to enter, or transition to, a saturation region, a cut-off region, or an active region depending on the type of transistor and technology used to implement the transistor.

"Source terminal" refers to a terminal of a transistor that serves as a source for a charge carrier either holes or electrons depending on the type of transistor and technology used to implement the transistor. "Drain terminal" refers to a terminal of a transistor that serves as a drain or sink for a charge carrier either holes or electrons depending on the type of transistor and technology used to implement the transistor.

The effective width of PMOS transistor T2 804 is the combined width of the ones of the parallel devices whose gates are connected to the node G. In the calibration process, the effective width of PMOS transistor T2 804 is set by which of the parallel devices have their gates connected to the node G by their switch being in a closed state and which have their gate left unconnected, with their switch in an open state. "Closed state" refers to a state of a switch in which current flows between two terminals of the switch. The switch is considered closed. "Open state" refers to a state of a switch in which no current flows between two terminals of the switch. The switch is considered open. The calibration settings may define which switches are open or which are closed or define a combination of both of these states for the set of switches.

In one embodiment, each PMOS transistor of the PMOS calibration bank 716 may be of the same or common type, size, shape, and configuration. In another embodiment, PMOS transistors of different types, sizes, shapes, and/or configurations may comprise the PMOS calibration bank 716.

A similar arrangement may be used to calibrate the effective width of NMOS transistor T1 802. A similar alternate location for the switch for the parallel devices may be located at the drain with direct connections for the source and gates. Methods for embodying a single functional transistor using multiple physical transistors connected in parallel are well understood in the art. This illustration is meant to provide an example, and not to limit the scope of the solution disclosed herein to any particular method or configuration.

Figure 13:
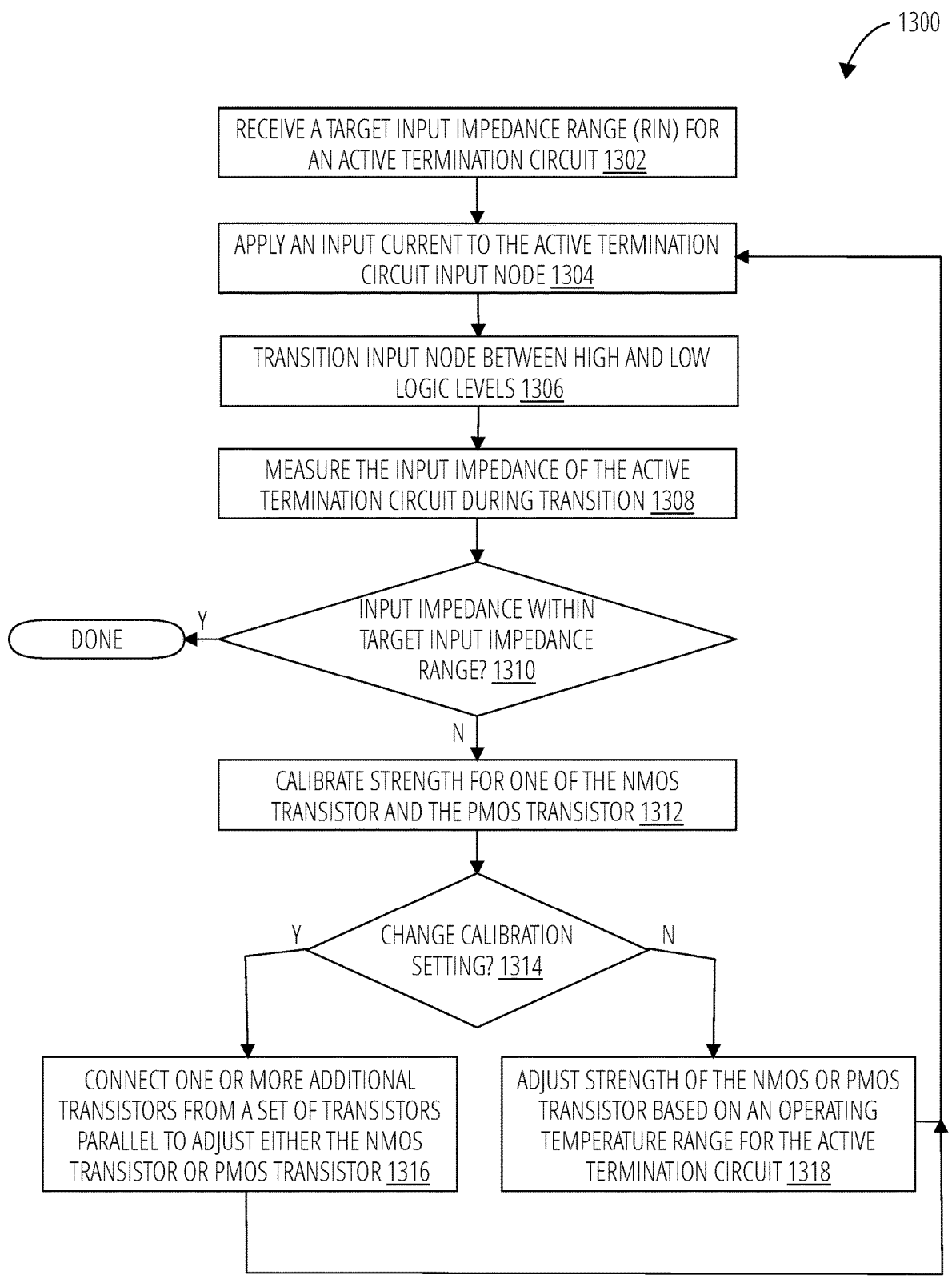
FIG. 13 illustrates a routine 1300 for calibrating an active termination circuit in accordance with one embodiment.

FIG. 13 illustrates a routine 1300 in accordance with one embodiment. The routine 1300 may begin at block 1302 with receiving a target input impedance range (Rin) for an active termination circuit. The active termination circuit may comprise a first transistor T1 704 and second transistor T2 708, diode connected, as introduced in FIG. 7, or an NMOS transistor TI 802 and PMOS transistor T2 804 as introduced in FIG. 8A.

In block 1304, an input current (Iin) may be applied to the input node of the active termination circuit. This input node may transition between a high logic level and a low logic level in block 1306. In this manner, the input impedance of the active termination circuit may be measured during the transition (block 1308). If it is determined in decision block 1310 that the measured input impedance falls within a target input impedance range, the routine 1300 may end.

If it is determined in decision block 1310 that the measured input impedance does not fall within the target input impedance range, the strength for one of the NMOS transistor and the PMOS transistor may be calibrated beginning at block 1312. If it is determined in decision block 1314 that the calibration setting is to be changed, the routine 1300 may proceed to block 1316. In block 1316, one or more additional transistors from a set of transistors may be connected in parallel to adjust either the NMOS transistor or PMOS transistor.

If it is determined in decision block 1314 that the strength of the transistor is not to be adjusted by changing the calibration setting, the routine 1300 may proceed to block 1318. In block 1318, the strength of the NMOS transistor or PMOS transistor may be adjusted based on an operating temperature range. After block 1316 and block 1318, the flow loops back to block 1304 to dither the input current for the configuration of NMOS transistor and/or PMOS transistor, and the input impedance response is again checked in block 1308.

In one embodiment of a process for a calibration process for trimming of the active termination circuit 700 of FIG. 7. The PMOS transistor T2 804 may in some embodiments be calibrated first. In other embodiments, the effective width of NMOS transistor T1 802 may also be calibrated, as discussed further below. In the flow of FIG. 13, the parameters for the NMOS transistor T1 802 may result from the process forming the circuit of FIG. 7. The flow of FIG. 13 may begin at step block 1302 with the parameters for NMOS transistor T1 802 set by processing and receiving a target Rin value. The flow of FIG. 13 may then vary the strength of PMOS transistor T2 804. The strength of PMOS transistor T2 804 may be varied by switching in and out the devices illustrated in FIG. 12.

Figure 14:
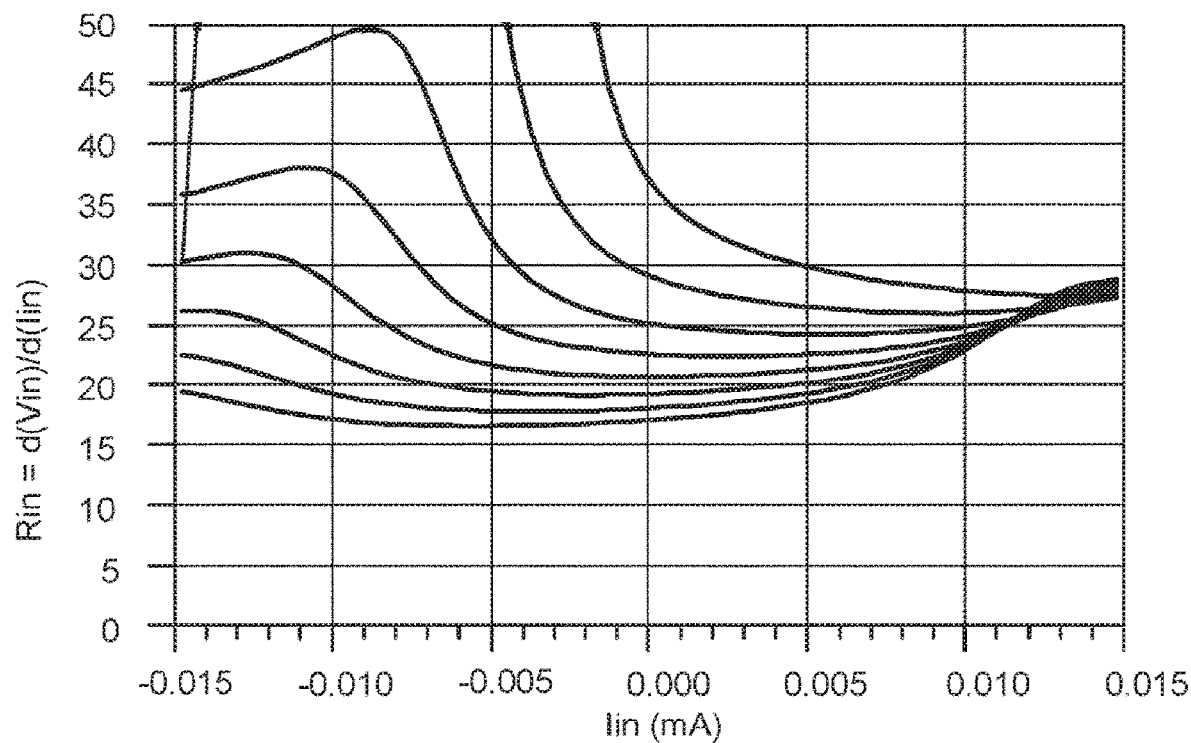
FIG. 14 and FIG. 15 consider the variation of the operation of the active termination circuit of FIG. 7 in response to varying elements of the circuit.

The process of block 1304, block 1306, and block 1308 may be illustrated by referring to FIG. 14, which illustrates the Iin versus Rin behavior of the active termination circuit 700 of FIG. 7 for different PMOS strengths. The different lines of FIG. 14 may correspond to switching the different devices of a configuration such as that illustrated in FIG. 12 in and out. The different strengths of NMOS transistor T1 802 show different amounts of flatness across the Iin values. As discussed above with respect to FIG. 11, in an application to digital signals, it is flatness in the region around Iin=0, corresponding to logic transitions, that is desirable. For the value ranges in FIG. 11, this means that the configuration of the individual devices providing the flattest curve between −0.005 mV and 0.005 mA, where the behavior outside of this range (corresponding the high and low logic states) is of lesser importance.

Figure 15:
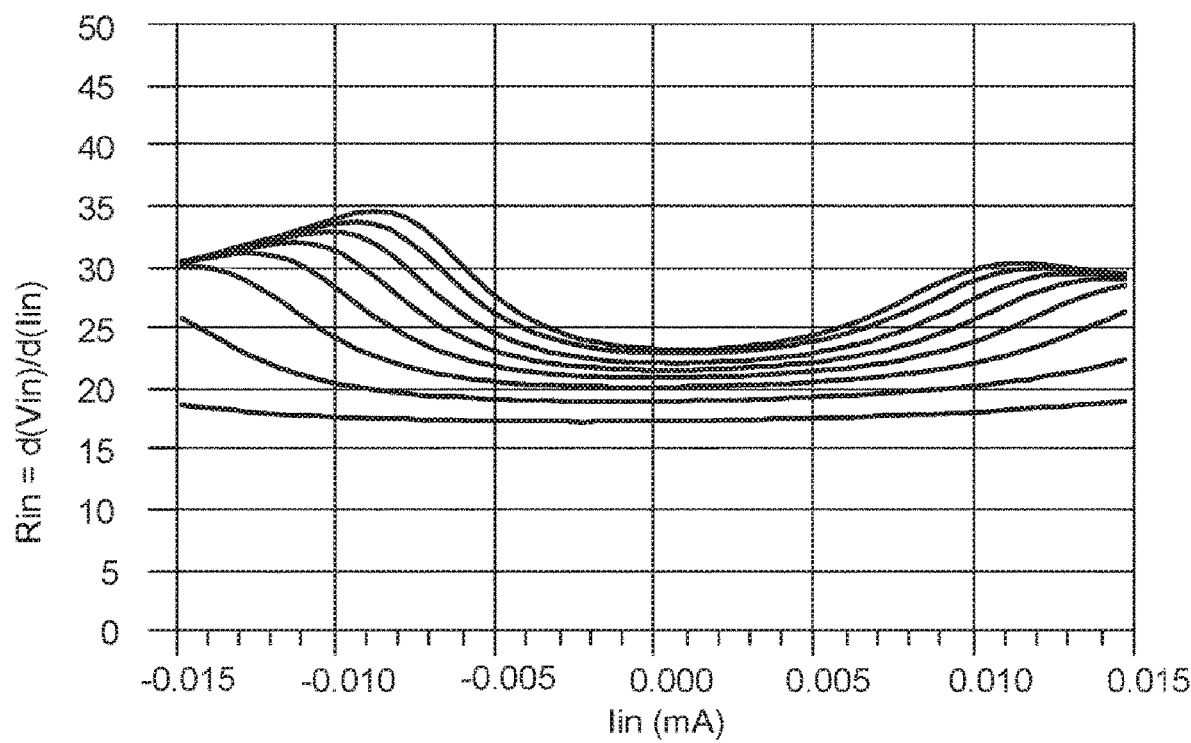

The process of block 1304, block 1306, and block 1308 may be illustrated by referring to FIG. 15, which illustrates the Iin versus Rin behavior of the active termination circuit 700 of FIG. 7 for different PMOS strengths. The different lines of FIG. 15 may correspond to switching the different devices of FIG. 12 in and out. The different strengths of PMOS transistor T2 804 show different amounts of flatness across the Iin values. As discussed above with respect to FIG. 11, in an application to digital signals, it is flatness in the region around Iin=0, corresponding to logic transitions, that is desirable. For the value ranges in FIG. 11, this means that the configuration of the individual devices of FIG. 12 providing the flattest curve between −0.005 mV and 0.005 mA, where the behavior outside of this range (corresponding the high and low logic states) is of lesser importance.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they may communicate electronic signals between them.

For purposes of this document, the terms "top" and "bottom," "upper" and "lower" and "vertical" and "horizontal," and forms thereof, as may be used herein are by way of example and illustrative purposes, and are not meant to limit the description of the technology inasmuch as the referenced item may be exchanged in position and orientation. Also, as used herein, the terms "substantially" and/or "about" mean that the specified dimension or parameter may be varied within an acceptable manufacturing tolerance for a given application. In one embodiment, the acceptable manufacturing tolerance is ±2.5% of a given dimension. An embodiment of the present technology will now be explained with reference to the following figures.

For purposes of this document, the term "based on" may be read as "based at least in part on." "Logic" refers to machine memory circuits, non-transitory machine readable media, and/or circuitry which by way of its material and/or material-energy configuration comprises control and/or procedural signals, and/or settings and values (such as resistance, impedance, capacitance, inductance, current/voltage ratings, etc.), that may be applied to influence the operation of a device. Magnetic media, electronic circuits, electrical and optical memory (both volatile and nonvolatile), and firmware are examples of logic. Logic specifically excludes pure signals or software per se (however does not exclude machine memories comprising software and thereby forming configurations of matter).

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. An active termination circuit comprising:
  an input node connected to a transmission line configured to supply a signal to the input node;
  a first transistor diode connected between a high voltage supply and the input node, the first transistor configured to terminate the signal in response to the signal being at a low logic level, wherein a first control gate of the first transistor is connected to the high voltage supply; and a second transistor diode connected between the input node and a low voltage supply, the second transistor configured to terminate the signal in response to the signal being at a high logic level, wherein a second control gate of the second transistor is connected to the low voltage supply.

2. The active termination circuit of claim 1, further comprising an inherent bias on terminals of the first transistor and the second transistor such that each transistor operates alternately within a saturation region and a cut-off region as the signal transitions between the high logic level and the low logic level.

3. The active termination circuit of claim 1, wherein the first transistor and the second transistor are calibrated to provide a dynamic termination impedance to the signal on the transmission line within a target input impedance range, wherein the dynamic termination impedance changes as the signal transitions between the low logic level and the high logic level.

4. The active termination circuit of claim 1, wherein at least one of the first transistor and the second transistor are calibrated to provide a termination impedance to the signal on the transmission line within a target input impedance range based on a temperature range that the active termination circuit is configured to operate in.

5. The active termination circuit of claim 1, wherein the first transistor comprises an NPN bipolar transistor and the second transistor comprises a PNP bipolar transistor and the high voltage supply is less than or equal to 1.4 volts.

6. The active termination circuit of claim 1, wherein the first transistor operates in a saturation region and the second transistor operates in a cut-off region in response to the signal having the low logic level and the second transistor operates in the saturation region and the first transistor operates in the cut-off region in response to the signal having the high logic level.

7. The active termination circuit of claim 1, wherein a strength of at least one of the first transistor and the second transistor is configurable.

8. An active termination circuit comprising:
an input node connected to a transmission line configured to supply a signal to the input node;
a first transistor diode connected between a high voltage supply and the input node, the transistor configured to terminate the signal in response to the signal being at a low logic level; and
a second transistor diode connected between the input node and a low voltage supply, the second transistor configured to terminate the signal in response to the signal being at a high logic level, wherein the first transistor comprises an NMOS transistor and the second transistor comprises a PMOS transistor.

9. The active termination circuit of claim 8, wherein the PMOS transistor comprises a set of PMOS transistors configured to be coupled in parallel with the input node and low voltage supply based on calibration settings that determine which PMOS transistors of the set of PMOS transistors are coupled in parallel.

10. An active termination circuit comprising:
an input node connected to a transmission line configured to supply a signal to the input node;
a first transistor diode connected between a high voltage supply and the input node, the transistor configured to terminate the signal in response to the signal being at a low logic level; and
a second transistor diode connected between the input node and a low voltage supply, the second transistor configured to terminate the signal in response to the signal being at a high logic level, wherein the first transistor comprises a set of transistors configured to connect in parallel by way of a set of switches, the set of switches set to one of an open state and a closed state based on a calibration setting.

11. An active termination circuit comprising:
an input node connected to a transmission line configured to supply a signal to the input node;
a first transistor diode connected between a high voltage supply and the input node, the transistor configured to terminate the signal in response to the signal being at a low logic level; and
a second transistor diode connected between the input node and a low voltage supply, the second transistor configured to terminate the signal in response to the signal being at a high logic level, wherein the second transistor comprises a set of transistors configured to connect in parallel by way of a set of switches, the set of switches set to one of an open state and a closed state based on a calibration setting.

12. A system, comprising:
a first integrated circuit mounted on a printed circuit board;
a second integrated circuit mounted on the printed circuit board;
an interconnect configured to operate as a transmission line transmitting signals between the first integrated circuit and the second integrated circuit; and
an active termination circuit formed within one of the first integrated circuit and the second integrated circuit, the active termination circuit comprising:
an input node configured to connect to the interconnect and configured to receive a signal from the interconnect;
an NMOS transistor having a gate terminal and a drain terminal each connected to a high voltage supply and a source terminal connected to the input node, the NMOS transistor configured to terminate the signal in response to the signal being in a low logic level; and
a PMOS transistor having a gate terminal and a drain terminal each connected a low voltage supply and a source terminal connect to the input node, the PMOS transistor configured to terminate the signal in response to the signal being in a high logic level.

13. The system of claim 12, wherein the NMOS transistor and the PMOS transistor of the active termination circuit are calibrated to provide a dynamic termination impedance to the signal from the interconnect, wherein the dynamic termination impedance changes as the signal transitions between the low logic level and the high logic level and the NMOS transistor and PMOS transistor comprise an inherent bias that exists as the NMOS transistor and the PMOS transistor transition alternately between a saturation region and a cut-off region.

14. The system of claim 12, wherein the first integrated circuit is a non-volatile memory storage controller and the second integrated circuit is a non-volatile memory die controller.

15. The system of claim 12, wherein the first integrated circuit is a non-volatile memory storage controller and the second integrated circuit is a uniform memory die;
the system further comprising a stack of uniform memory dies each uniform memory die coupled to each other in series by a wire bond; and
wherein the active termination circuit is within each uniform memory die of the stack of uniform memory dies.

16. The system of claim 12, further comprising:
a temperature sensor configured to sense a temperature for one of the first integrated circuit and the second integrated circuit;
a storage controller configured to:
store a set of calibration settings for one or more of the NMOS transistor and the PMOS transistor, the set of calibration settings used to calibrate one of the NMOS transistor and the PMOS transistor; and
change calibration settings for one of the NMOS transistor and the PMOS transistor in response to the temperature sensor sensing a temperature below or above a temperature threshold.

17. The system of claim 16, wherein the storage controller is further configured to change calibration settings for the PMOS transistor in response to the temperature sensed by the temperature sensor being greater than or equal to about 100° C. and less than or equal to about −25° C.

18. A method for calibrating an active termination circuit, the method comprising: receiving a target input impedance range (Rin) for an active termination circuit, the active termination circuit comprising:
an NMOS transistor diode connected between a high voltage supply and an input node; and
a PMOS transistor diode connected between the input node and a low voltage supply;
measuring an input impedance as an input current (Ln), applied to the input node, transitions between a high logic level and a low logic level;
determining whether the measured input impedance falls within the target input impedance range; and
calibrating a strength for one of the NMOS transistor and the PMOS transistor in response to the input impedance falling outside the target input impedance range.

19. The method of claim 18, wherein:
one of the NMOS transistor and the PMOS transistor comprises a set of transistors, each of a common transistor type, configured to connect in parallel by way of a set of switches set to one of an open state and a closed state based on a calibration setting; and
wherein calibrating the strength for one of the NMOS transistor and the PMOS transistor comprises changing the calibration setting such that one or more additional transistors from the set of transistors is connected in parallel as one of the NMOS transistor and the PMOS transistor.

20. The method of claim 18, wherein calibrating the strength for one of the NMOS transistor and the PMOS transistor comprises adjusting a strength of one of the NMOS transistor and the PMOS transistor based on an operating temperature range for the active termination circuit.

* * * * *